United States Patent
Kushiyama

(10) Patent No.: US 7,538,369 B2
(45) Date of Patent: May 26, 2009

(54) RESISTANCE-CHANGE-TYPE FUSE CIRCUIT

(75) Inventor: Natsuki Kushiyama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 11/741,222

(22) Filed: Apr. 27, 2007

(65) Prior Publication Data

US 2007/0278615 A1    Dec. 6, 2007

(30) Foreign Application Priority Data

Apr. 28, 2006    (JP) .............................. 2006-126519

(51) Int. Cl.
*H01L 27/10* (2006.01)
(52) U.S. Cl. ............... 257/209; 257/529; 257/E23.147; 257/E23.149
(58) Field of Classification Search ................ 257/209, 257/529, 530, E23.147, E23.149
See application file for complete search history.

(56) References Cited

U.S. PATENT DOCUMENTS 6,525,397 B1    2/2003    Kalnitsky et al.
6,876,057 B2 *  4/2005    Watanabe .................. 257/529

\* cited by examiner

*Primary Examiner*—Hoai V Pham
(74) *Attorney, Agent, or Firm*—Oblon, Spivak, McClelland, Maier & Neustadt, P.C.

(57) ABSTRACT

A resistance-change-type fuse circuit has a plurality of polysilicon fuses which are made of polysilicon and causes irreversible change in resistance by flowing a current; a plurality of programming transistors which are provided corresponding to the plurality of fuses, each programming transistor switching whether to flow the current through the corresponding fuse to cause change in resistance with respect to the polysilicon fuses, a dummy fuse group including a plurality of dummy fuses having the same electrical properties as that of the polysilicon fuses, each dummy fuse having 1/n (n is an integer equal to or more than 1) times a resistance of the polysilicon fuses, a dummy transistor circuit which has at least one of dummy transistor having 1/n times a conductance of the programming transistors, a gate and a drain of the dummy transistor being connected to each other, and a current mirror circuit including the programming transistor and the dummy transistor, the current mirror circuit causing each polysilicon fuse to flow n times the current flowing through the dummy fuse group.

18 Claims, 20 Drawing Sheets

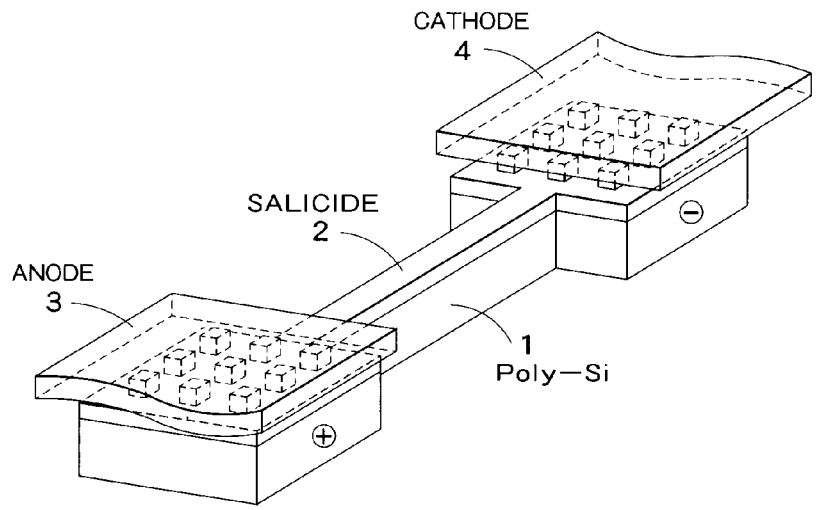
STRUCTURE OF POLYSILICON RESISTANCE-CHANGE-TYPE FUSE PORTION
F I G. 1
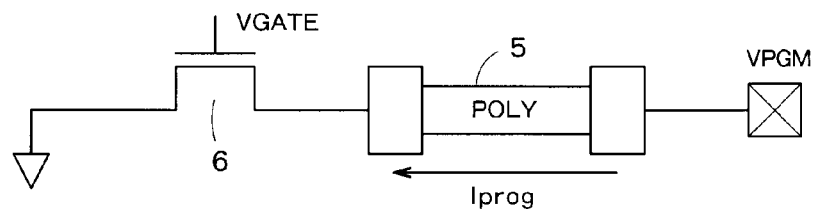
POLYSILICON RESISTANCE-CHANGE-TYPE FUSE
AND PROGRAMMING NMOS TRANSISTER
F I G. 2

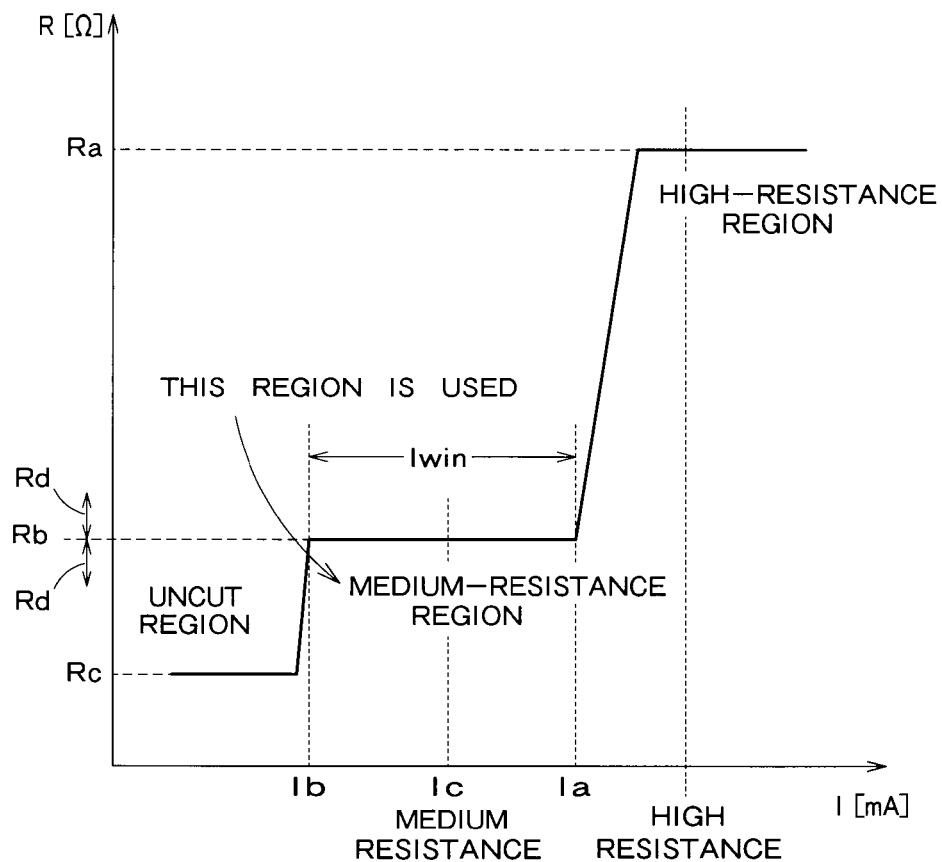
RELATIONSHIP BETWEEN CURRENT CAUSED TO FLOW THROUGH POLYSILICON RESISTANCE-CHANG-TYPE FUSE AND RESISTANCE VALUE AFTER PROGRAMMING
F I G. 3

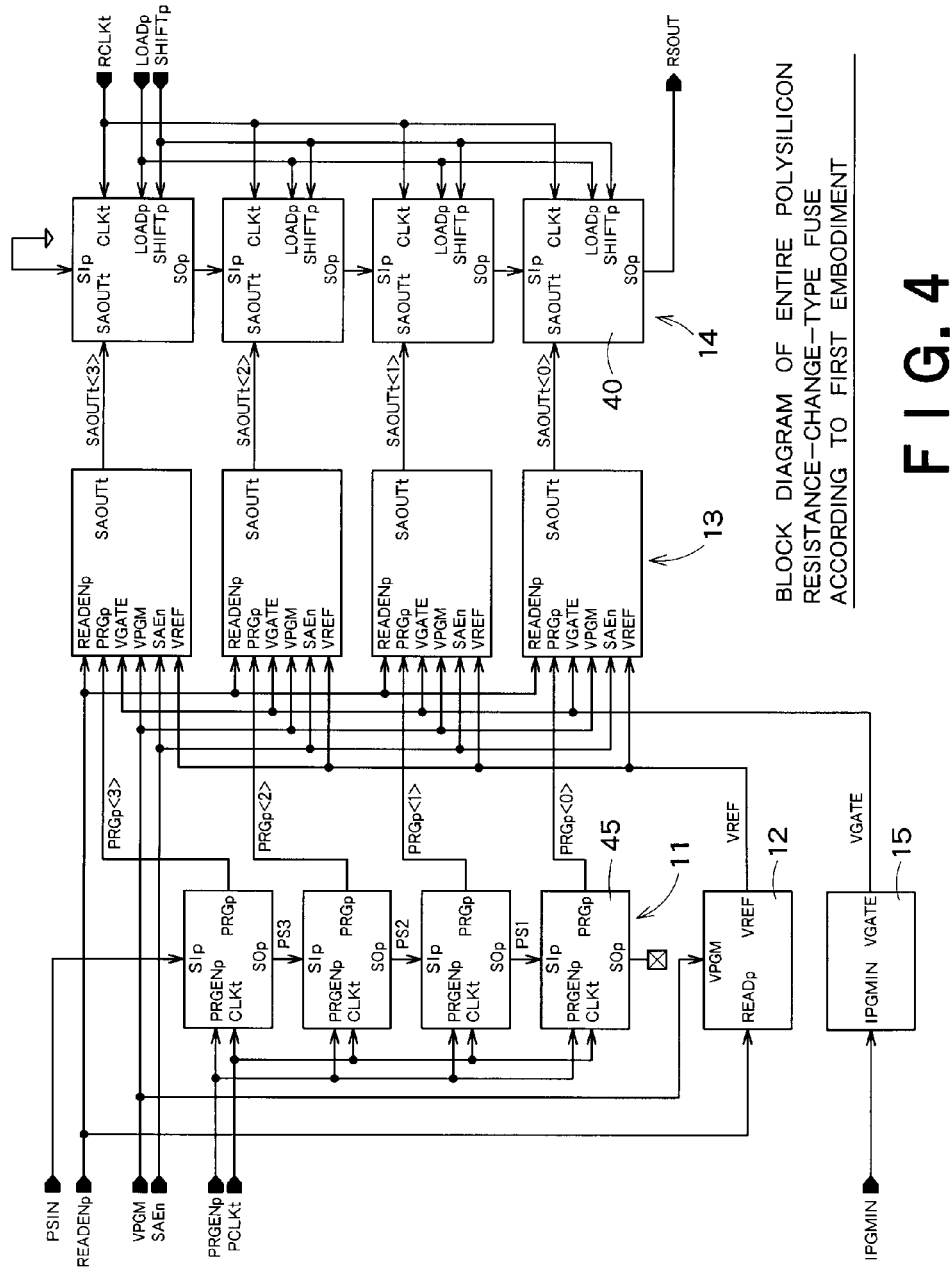
F I G. 4
BLOCK DIAGRAM OF ENTIRE POLYSILICON RESISTANCE-CHANGE-TYPE FUSE ACCORDING TO FIRST EMBODIMENT

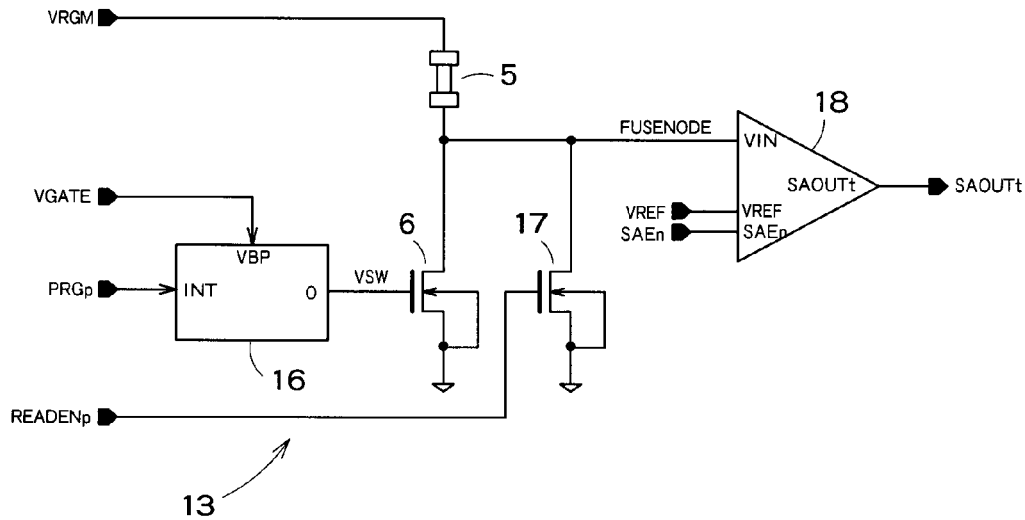
FUSE PROGRAMMING SENSE CIRCUIT
F I G. 5
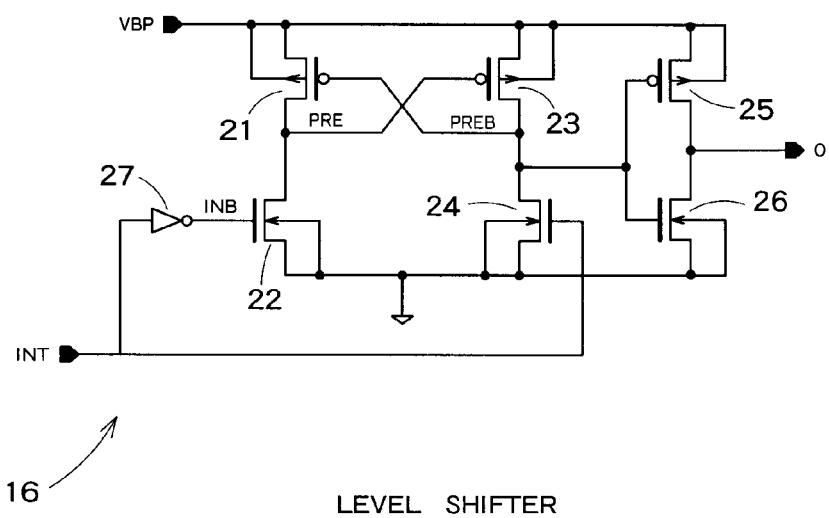
LEVEL SHIFTER
F I G. 6

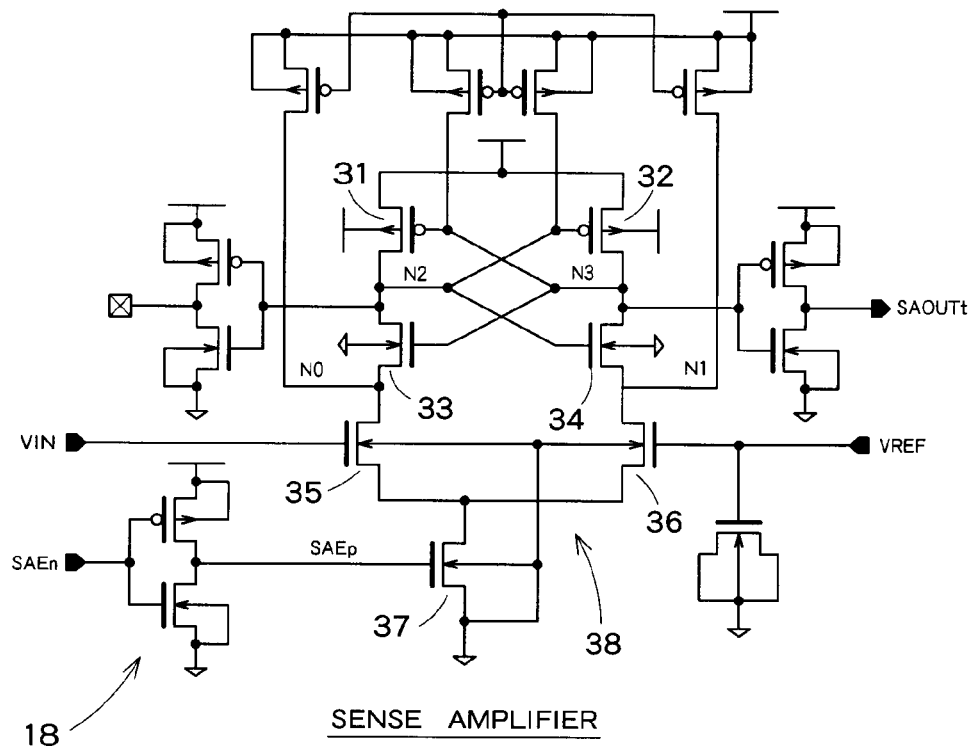
SENSE AMPLIFIER
F I G. 7
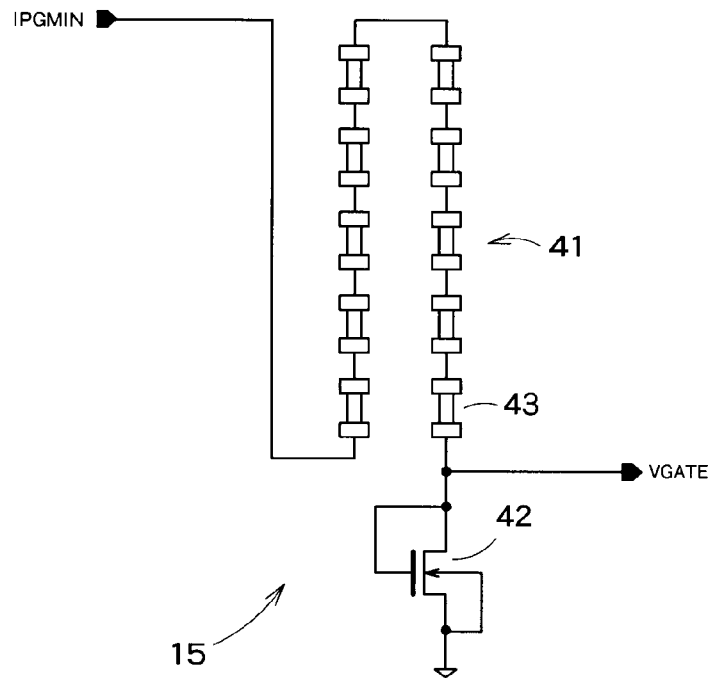
FIRST EMBODIMENT OF VGATE GENERATOR
F I G. 8

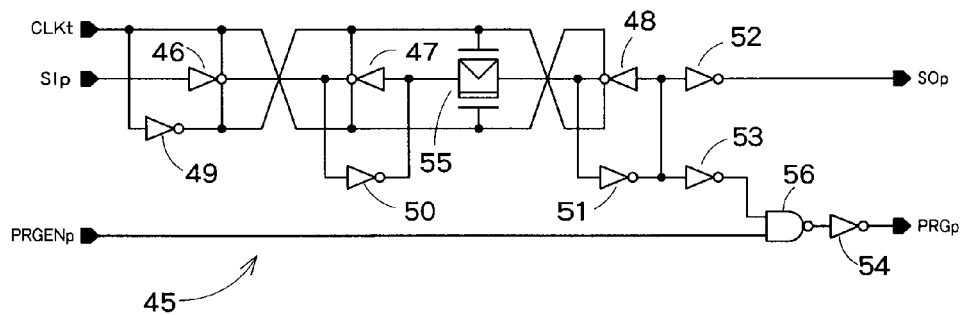
PROGRAMMING SHIFT REGISTER
F I G. 9
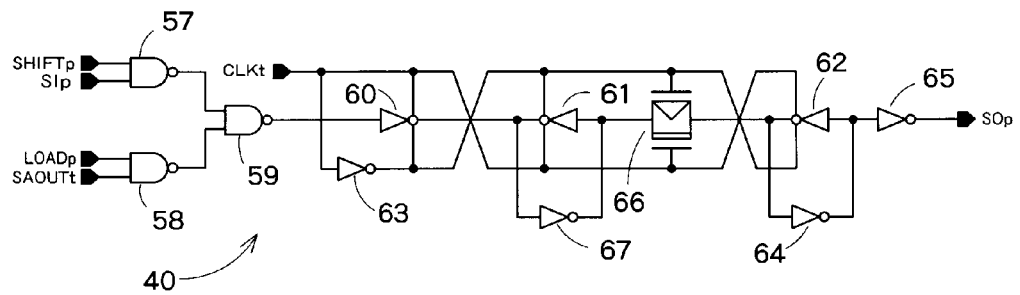
READOUT SHIFT REGISTER
F I G. 10

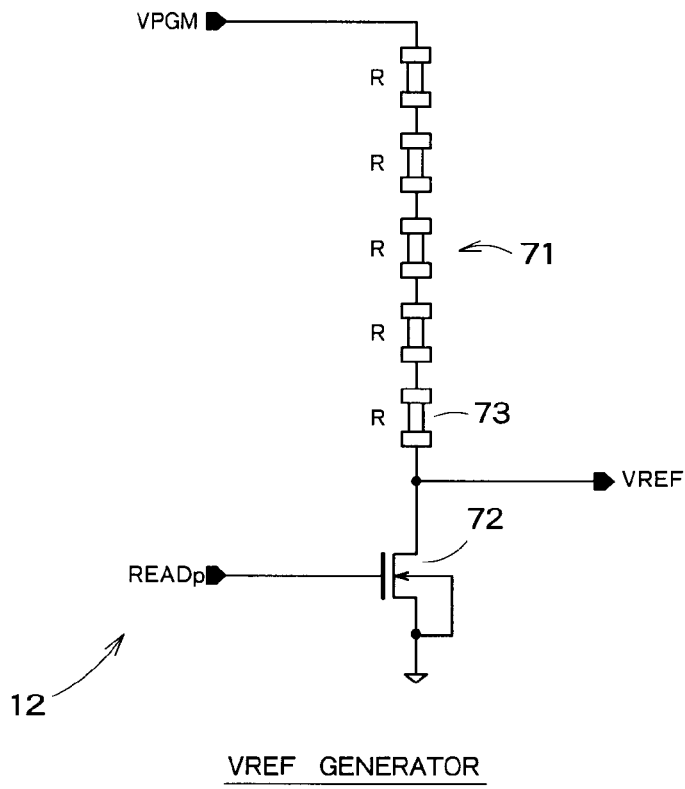
VREF GENERATOR
F I G. 11
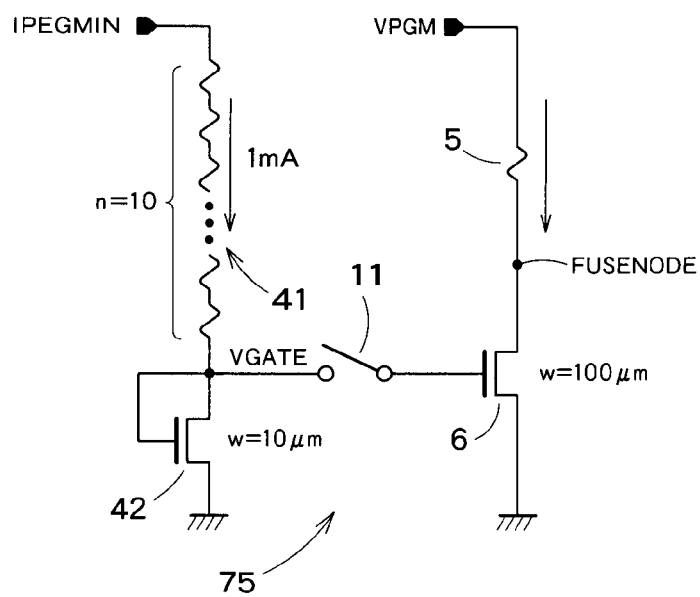
F I G. 12

|  | SOURCE | GATE | DRAIN |
|---|---|---|---|
| DUMMY NMOS TRANSISTOR | GND | VGATE | VGATE |
| PROGRAMMING NMOS TRANSISTOR | GND | VGATE | VGATE |
F I G. 13
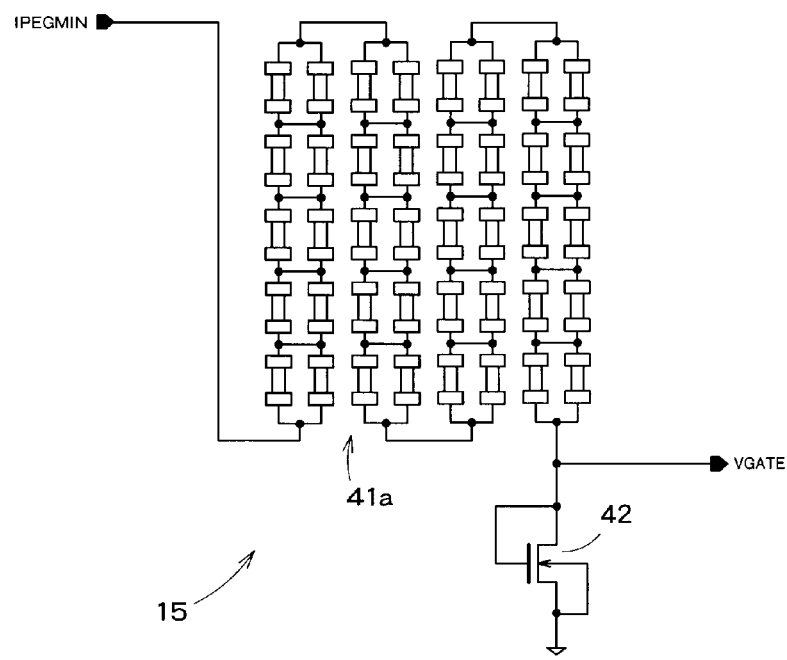
SECOND EMBODIMENT OF VGATE GENERATOR
F I G. 14

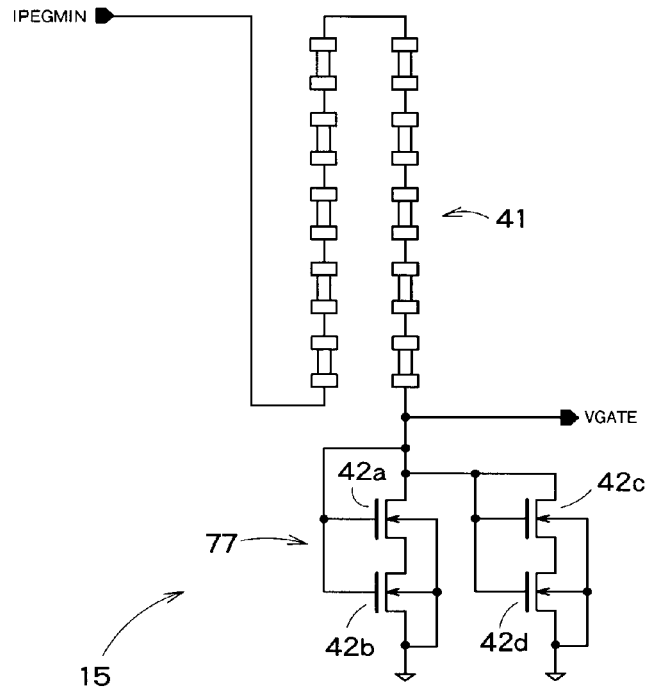
THIRD EMBODIMENT OF VGATE GENERATOR
F I G. 15
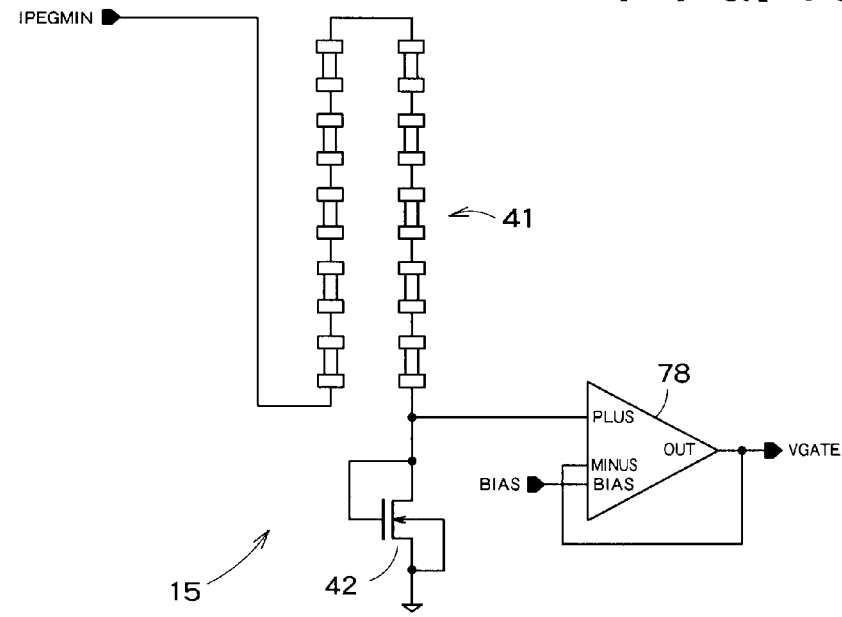
FOURTH EMBODIMENT OF VGATE GENERATOR
F I G. 16

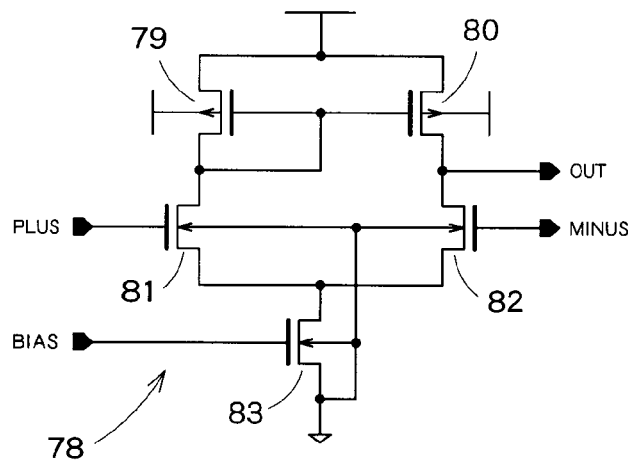
VOLTAGE FOLLOWER CIRCUIT IN FOURTH
EMBODIMENT OF VGATE GENERATOR
F I G. 17
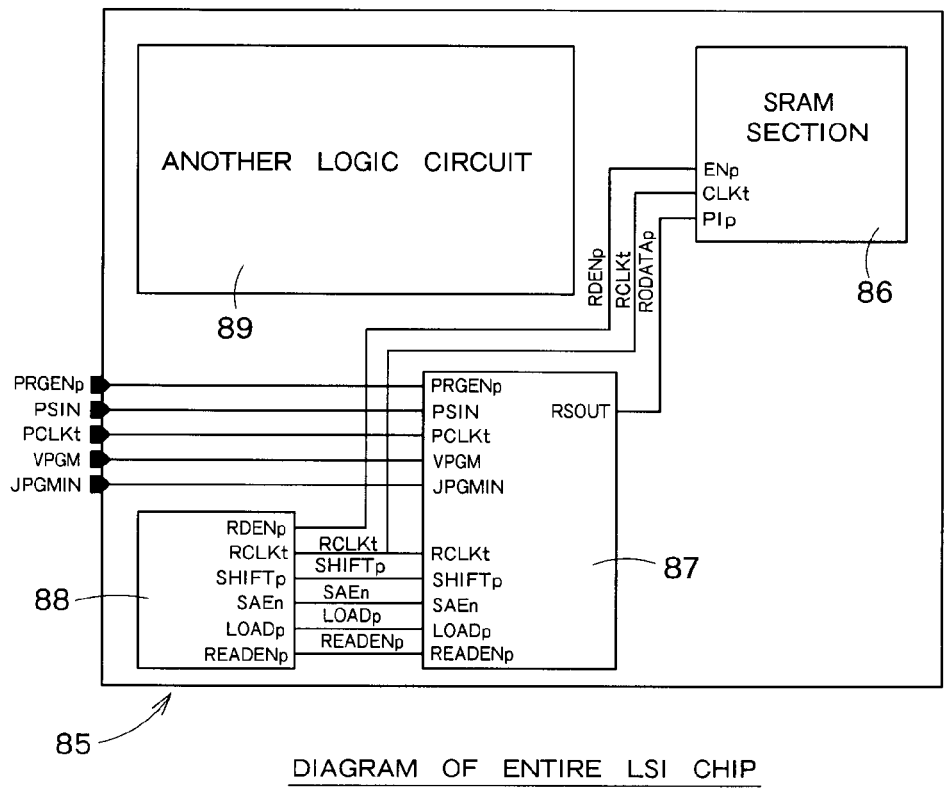
DIAGRAM OF ENTIRE LSI CHIP
F I G. 18

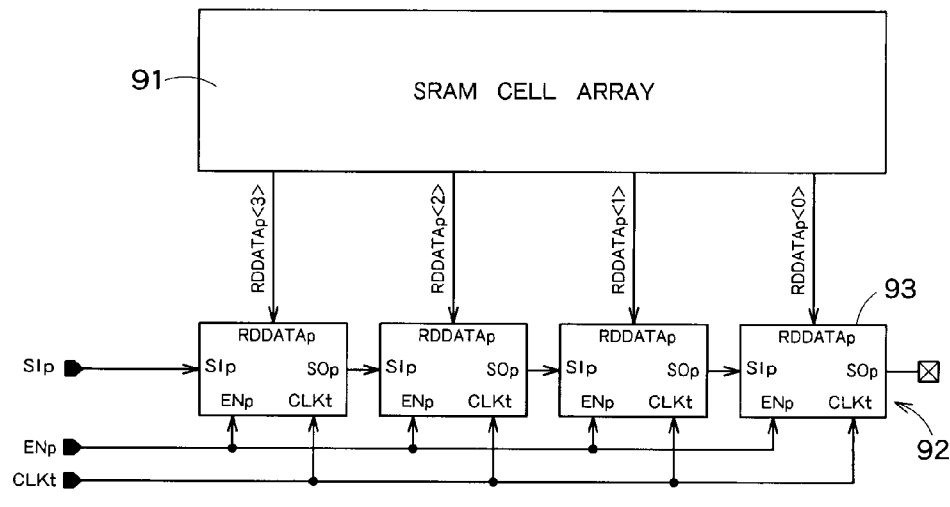
CIRCUIT DIAGRAM OF SRAM SECTION
F I G. 19
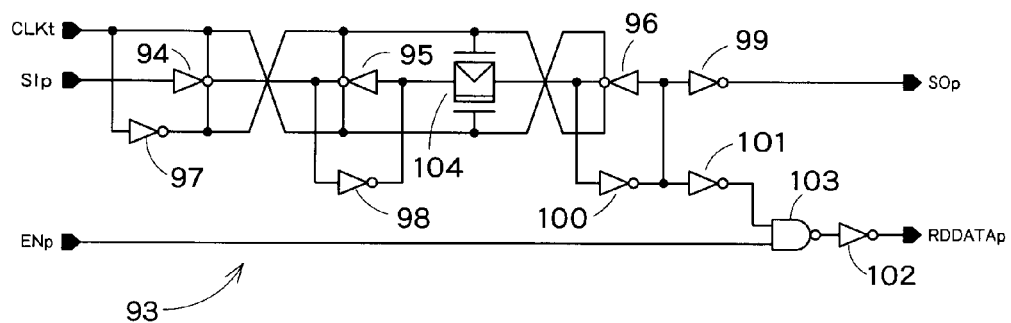
CIRCUIT DIAGRAM OF SHIFT REGISTER FOR
STORING REDUNDANCY INFORMATION FOR SRAM
F I G. 20

OPERATING WAVEFORM AT THE TIME OF WRITING TO FUSES
F I G. 21
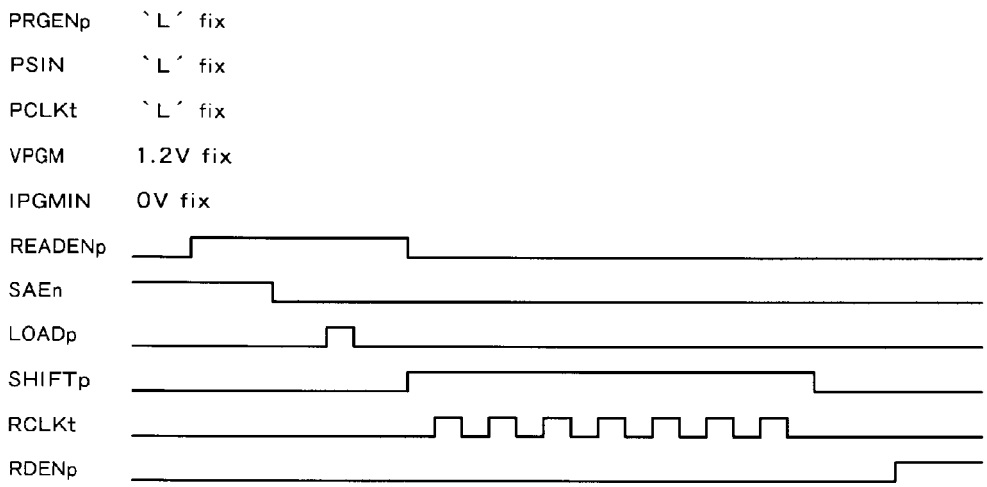
OPERATING WAVEFORM AT THE TIME OF NORMAL STARTUP
(READOUT FROM FUSES)
F I G. 22

BLOCK DIAGRAM OF ENTIRE POLYSILICON RESISTANCE-CHANGE-TYPE FUSE

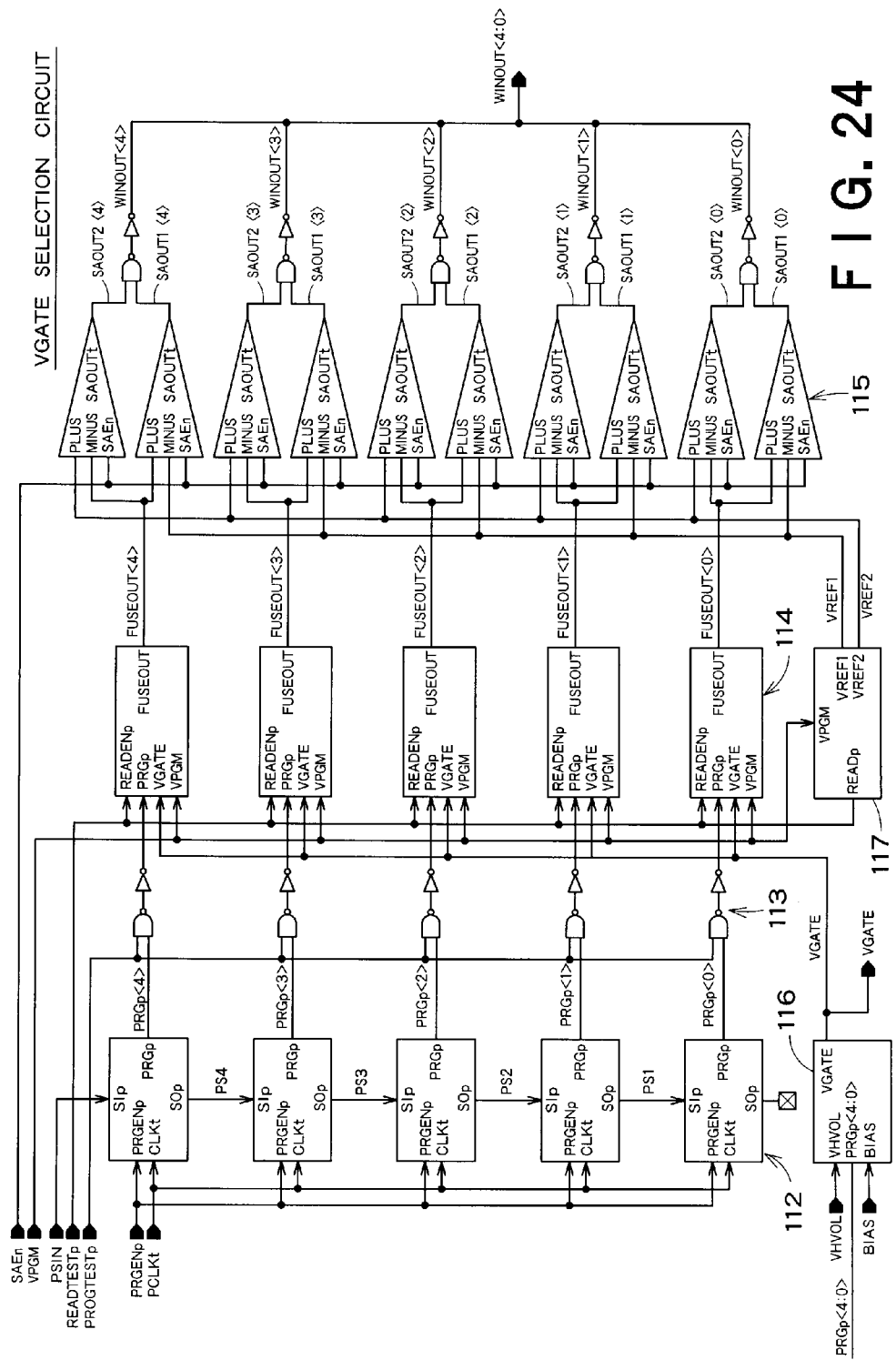
F I G. 24

TRIAL-CUTTING POLYSILICON FUSE

VGATE GENERATOR

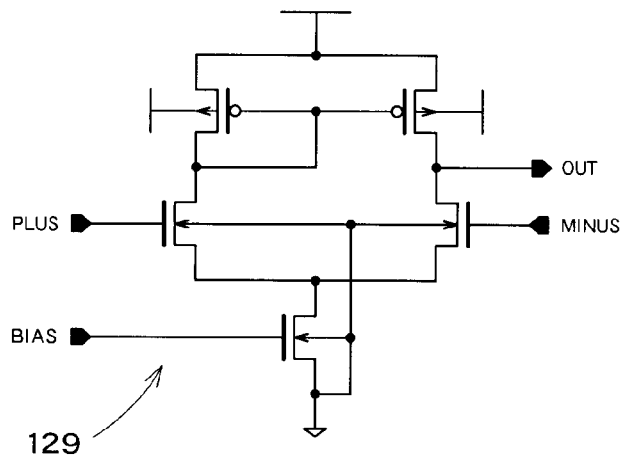
CIRCUIT DIAGRAM OF VOLTAGE FOLLOWER CIRCUIT
F I G. 27
| PRGp<4:0> | VGATE POTENTIAL |
|---|---|
| 00001 | 1.3V |
| 00010 | 1.4V |
| 00100 | 1.5V |
| 01000 | 1.6V |
| 10000 | 1.7V |
F I G. 28
| PRGp<4:0> | TYPE OF TRIAL-CUTTING POLYSILICON FUSES | VGATE AT THE TIME OF TRIAL CUTTING |
|---|---|---|
| 00001 | LOWERMOST ONE | 1.3V |
| 00010 | SECOND FROM BOTTOM | 1.4V |
| 00100 | THIRD FROM BOTTOM | 1.5V |
| 01000 | FOURTH FROM BOTTOM | 1.6V |
| 10000 | UPPERMOST ONE | 1.7V |
F I G. 29

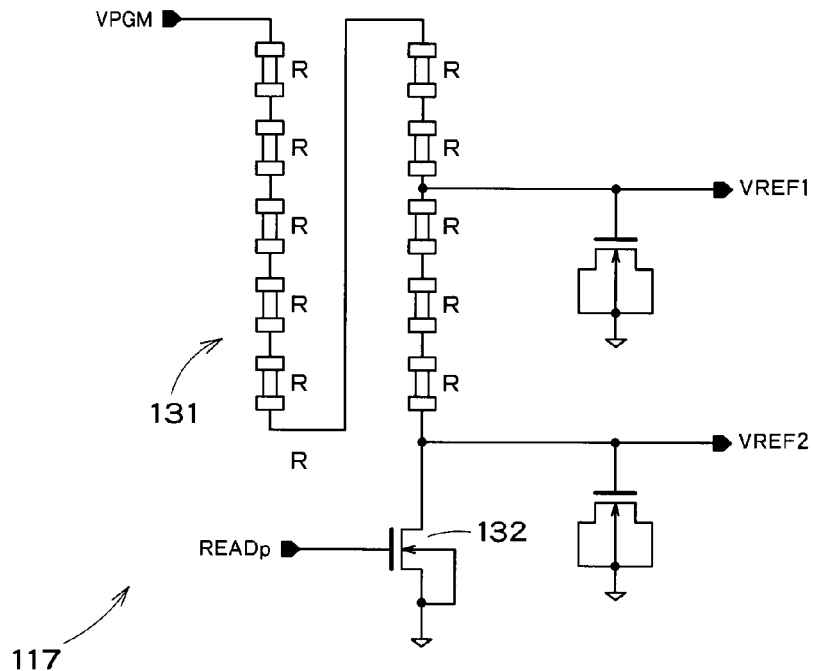
VREF GENERATOR FOR TRIAL-CUTTING POLYSILICON FUSE
F I G. 30
| TRIAL-CUTTING POLYSILICON FUSES | VGATE AT THE TIME OF TRIAL CUTTING | RESISTANCE AFTER TRIAL CUTTING | WINOUT |
|---|---|---|---|
| LOWERMOST ONE | 1.3V | Rc | 0 |
| SECOND FROM BOTTOM | 1.4V | Rb | 1 |
| THIRD FROM BOTTOM | 1.5V | Rb | 1 |
| FOURTH FROM BOTTOM | 1.6V | Rb | 1 |
| UPPERMOST ONE | 1.7V | Ra | 0 |
F I G. 31

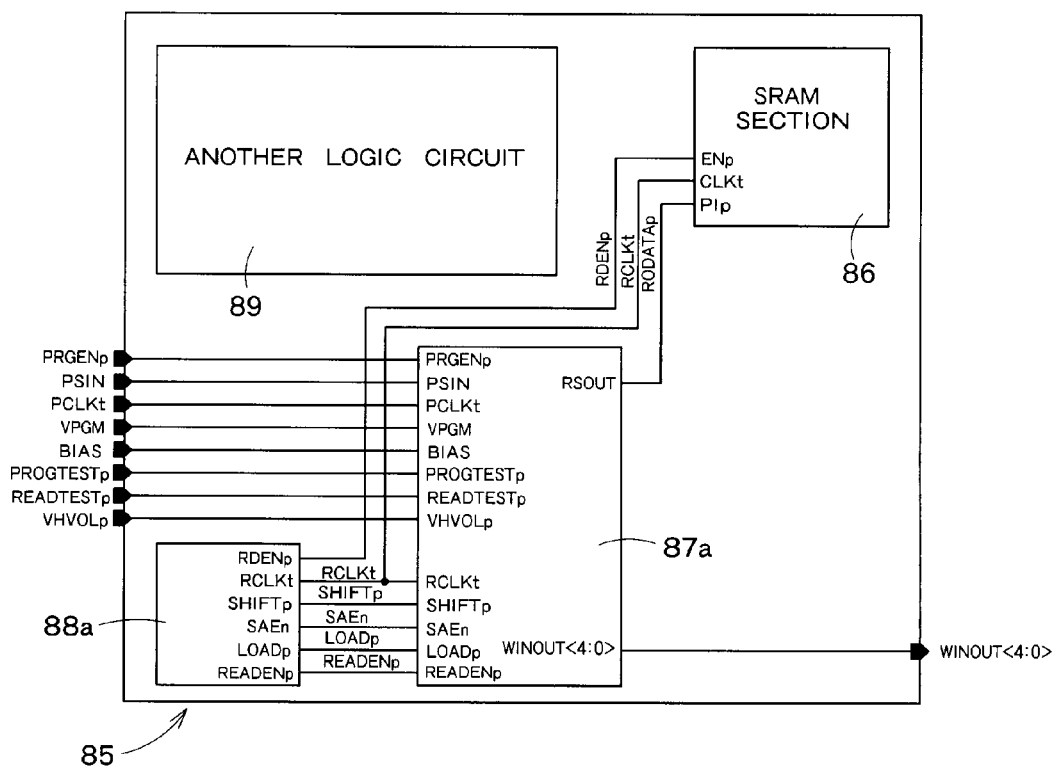
F I G. 32

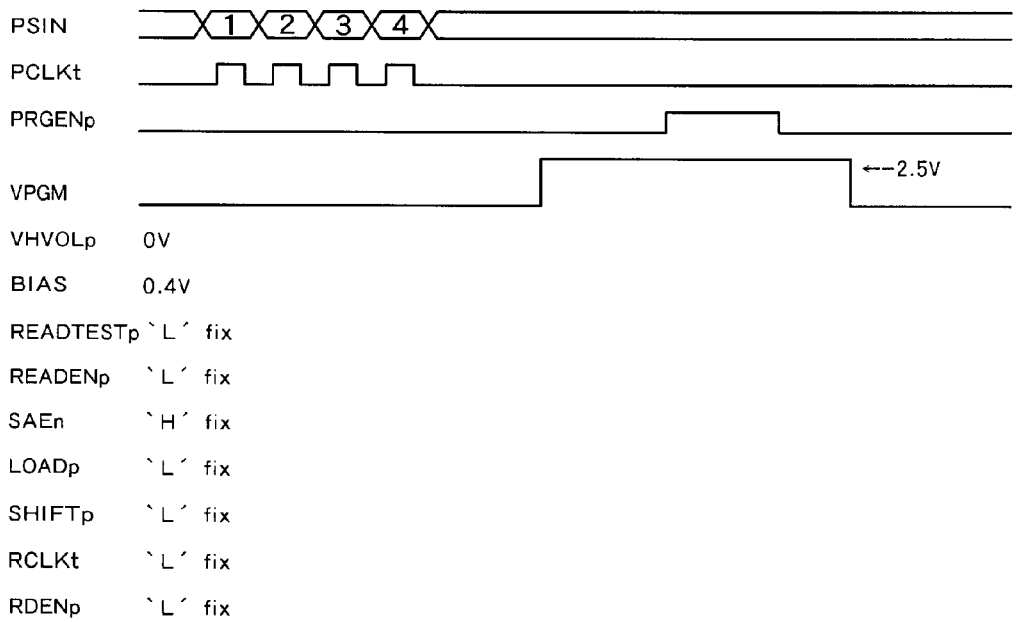
OPERATING WAVEFORM AT THE TIME OF WRITING TO FUSES
F I G. 35
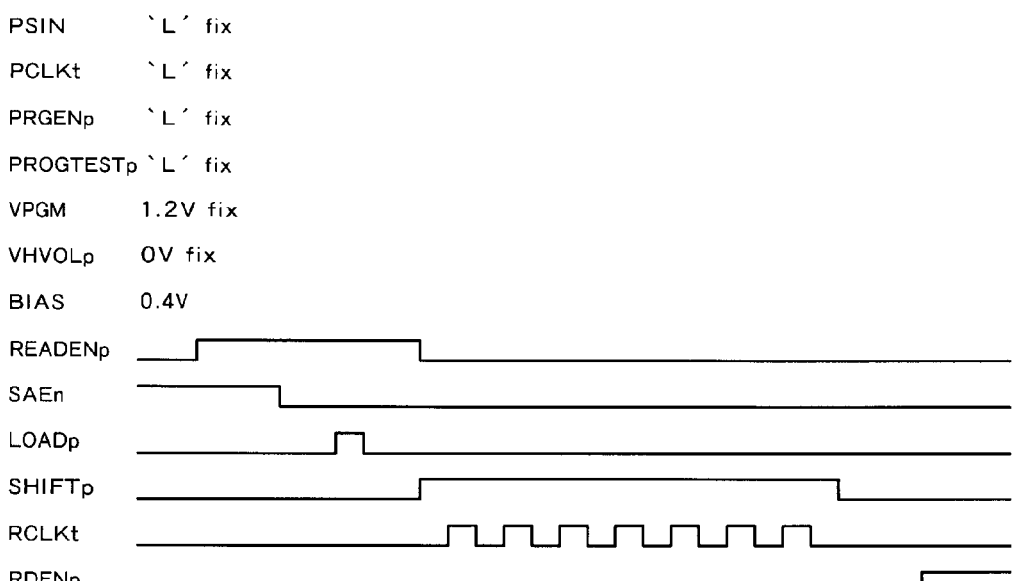
OPERATING WAVEFORM AT THE TIME OF NORMAL STARTUP
(READOUT FROM FUSES)
F I G. 36

US 7,538,369 B2

RESISTANCE-CHANGE-TYPE FUSE CIRCUIT

CROSS REFERENCE TO RELATED APPLICATIONS

This application is based upon and claims the benefit of priority from the prior Japanese Patent Application No. 2006-126519, filed on Apr. 28, 2006, the entire contents of which are incorporated herein by reference.

BACKGROUND OF THE INVENTION

1. Field of the Invention

The present invention relates to a resistance-change-type fuse circuit which causes a current to flow through a polysilicon fuse to cause a change in resistance.

2. Related Art

In recent years, system LSIs in which a large number of memories such as SRAMs and DRAMs are mixedly mounted on a chip have come into wide use. Such on-chip SRAMs and DRAMs have become finer and the capacity of such memories is being increased. It is, therefore, difficult to achieve 100% yield in producing such memories.

A method has therefore been used in which redundant cells are incorporated and cells determined as defectives by a test are replaced with the redundant cells to improve the yield. Information on which cells are replaced with redundant cells is ordinarily programmed in one time programmable (OTP) devices capable of being programmed only once.

A process management method has also been practiced in which ID information specific to a chip (chip ID) including a name of a factory where the chip has been manufactured, a line number, a lot number, a wafer number and X- and Y-coordinates on the wafer is programmed in OTP elements, and in which when the chip is sent back because of occurrence of a fault with the chip on the market, the chip ID is read out to check whether or not there has been any abnormality in the manufacturing process.

OTP elements in which redundancy information for the above-mentioned on-chip SRAMs and DRAMs and chip ID information are programmed include optically programmable fuses which are programmed by using light such as laser light, and electrically programmable fuses.

Optically programmable fuses have an advantage in that fabrication processes are easy and a ratio of the resistance of an element already programmed to the resistance of an intact element is large. Therefore, the optically programmable fuses have been widely used. However, optically programmable fuses have a drawback in that it is impossible to program it after the chip is assembled into a package. On the other hand, electrically programmable fuses have an advantage in that it is possible to program it after packaging the chip. Therefore, recently, the electrically programmable fuses have been widely used (see U.S. Pat. No. 6,525,397).

As one of electrically programmable fuses, a polysilicon resistance-change-type fuse (hereinafter referred to as "polysilicon fuse") exists which is programmed in such a manner that a large current is caused to flow through polysilicon in salicide form used as a gate material, and electromigration phenomenon occurs in which metal atoms in the salicide portion on polysilicon is moved in the same direction as the electron, thereby increasing the resistance of polysilicon for programming.

However, the conventional polysilicon resistance-change-type fuse has problems described below.

1) The current flowing through the polysilicon fuse is controlled through a voltage VPGM applied to one end of the fuse and a voltage VGATE applied to a gate of a transistor (programming transistor) for switching control as to whether or not the current is to be caused to flow through the fuse. The optimum values of the voltages VPGM and VGATE depend on the characteristics of the polysilicon fuse and the programming transistor.

When the characteristics of the programming transistor are changed due to fluctuation in manufacturing process, there is a possibility of changing the drain current Ids of the transistor and deviating from the desired current range even if a constant voltage is applied to the gate. Deviation from the desired current range may lead to failure to program the polysilicon fuse. Possible causes of programming failure include a situation where the current is so small that the resistance value of the fuse does not change, and a situation where the current is so large that the fuse has an excessively high resistance.

2) With fluctuation in the manufacturing process, the thickness and width of the polysilicon fuse change slightly to vary the resistance value of the fuse before programming. If the resistance value of the polysilicon fuse before programming varies, there is a possibility in which the drain voltage Vds of the programming transistor changes so that the drain current Ids of the programming transistor fluctuates and deviates from the desired current range. Also in this case, there is a possibility of failure to program the polysilicon fuse.

3) An arrangement may be adopted in which several combinations of a trial-cutting polysilicon fuse and a programming transistor are prepared on one chip and voltages for the combinations are successively applied to cause a current to flow. However, the operation to measure the current with an ordinary semiconductor tester while changing the voltage requires a long time to perform. It is necessary to obtain the optimum value by repeating the operation several times. A further increased operation time is required for this, and the testing efficiency is reduced. As a result, the testing cost increases.

4) The act to program the polysilicon fuse is irreversible. Once a current is caused to flow through the polysilicon fuse, the fuse cannot be again programmed. In a case where the voltages VPGM and VGATE are changed to find the optimum combination of the voltages VPGM and VGATE, there is a need to prepare the number of combinations of the trial-cutting polysilicon fuse and the programming NMOS transistor in correspondence with the number of combinations of VPGM and VGATE. This means an increase in chip area and, hence, an increase in chip cost.

SUMMARY OF THE INVENTION

According to one embodiment of the present invention, a resistance-change-type fuse circuit, comprising:

a plurality of polysilicon fuses which are made of polysilicon and causes irreversible change in resistance by flowing a current;

a plurality of programming transistors which are provided corresponding to the plurality of fuses, each programming transistor switching whether to flow the current through the corresponding fuse to cause change in resistance with respect to the polysilicon fuses;

a dummy fuse group including a plurality of dummy fuses having the same electrical properties as that of the polysilicon fuses, each dummy fuse having 1/n (n is an integer equal to or more than 1) times a resistance of the polysilicon fuses;

a dummy transistor circuit which has at least one of dummy transistor having 1/n times a conductance of the programming transistors, a gate and a drain of the dummy transistor being connected to each other; and a current mirror circuit including the programming transistor and the dummy transistor, the current mirror circuit causing each polysilicon fuse to flow n times the current flowing through the dummy fuse group.

Furthermore, according to one embodiment of the present invention, a semiconductor integrated circuit, comprising:

a resistance-change-type fuse circuit which has a plurality of polysilicon fuses capable of causing irreversible change in resistance by flowing a current;

a fuse control circuit which controls whether irreversible change in resistance occurs in the plurality of polysilicon fuses; and a memory circuit which has a plurality of memory cells and redundant cells, the memory circuit controlling whether the memory cells are replaced with the redundant cells based on the output of the resistance-change-type fuse circuit, wherein the resistance-change-type fuse circuit includes:

a plurality of polysilicon fuses which are made of polysilicon and causes irreversible change in resistance by flowing a current;

a plurality of programming transistors which are provided corresponding to the plurality of fuses, each programming transistor switching whether to flow the current through the corresponding fuse to cause change in resistance;

a dummy fuse group including a plurality of dummy fuses having the same electrical properties as that of the polysilicon fuses, each dummy fuse having 1/n (n is an integer equal to or more than 1) times a resistance of the polysilicon fuses;

a dummy transistor circuit which has at least one of dummy transistor having 1/n times a conductance of the programming transistors, a gate and a drain of the dummy transistor being connected to each other; and a current mirror circuit including the programming transistor and the dummy transistor, the current mirror circuit causing each polysilicon fuse to flow n times the current flowing through the dummy fuse group.

Furthermore, according to one embodiment of the present invention, a resistance-change-type fuse circuit, comprising:

a plurality of polysilicon fuses which are made of polysilicon and causes irreversible change in resistance by flowing a current;

a plurality of programming transistors which are provided corresponding to the plurality of polysilicon fuses, each programming transistor switching whether to flow the current through the corresponding fuse to cause change in resistance with respect to the polysilicon fuses;

a plurality of trial-cutting polysilicon fuses which have the same electrical properties as those of the plurality of polysilicon fuses;

a current supply section which flows the current different from each other with respect to the plurality of trial-cutting polysilicon fuses; and a resistance estimating section which estimates resistances of the plurality of trial-cutting polysilicon fuses after flowing the current through the plurality of trial-cutting fuses by the current supply section.

BRIEF DESCRIPTION OF THE DRAWINGS

FIG. 1 is a perspective view schematically showing the structure of a polysilicon fuse;

FIG. 2 is a diagram showing the connection relationship between a polysilicon fuse 5 and a programming NMOS transistor 6;

FIG. 3 is a diagram showing the relationship between a current caused to flow through the polysilicon fuse 5 and the resistance value of the polysilicon fuse 5 after programming;

FIG. 4 is a block diagram showing the entire configuration of a resistance-change-type fuse circuit according to a first embodiment of the present invention;

FIG. 5 is a circuit diagram showing an example of the internal configuration of a fuse programming sense circuit 13;

FIG. 6 is a circuit diagram showing an example of the internal configuration of a level shifter 16;

FIG. 7 is a circuit diagram showing an example of the internal configuration of a sense amplifier 18 shown in FIG. 5;

FIG. 8 is a circuit diagram showing an example of the internal configuration of a VGATE generator 15 shown in FIG. 1;

FIG. 9 is a circuit diagram showing an example of the internal configuration of each register 45 in a programming shift register 11 shown in FIG. 1;

FIG. 10 is a circuit diagram showing an example of the internal configuration of each register 40 in a readout shift register 14 shown in FIG. 1;

FIG. 11 is a circuit diagram showing an example of the internal configuration of a VREF generator 12 shown in FIG. 1;

FIG. 12 is an equivalent circuit diagram of a current mirror circuit 75;

FIG. 13 is a diagram collectively showing the voltage relationship between a dummy NMOS transistor 42 in the VGATE generator 15 and the programming NMOS transistor 6;

FIG. 14 is a circuit diagram showing an example of the internal configuration of a VGATE generator 15 according to a second embodiment of the present invention;

FIG. 15 is a circuit diagram showing an example of the internal configuration of a VGATE generator 15 according to a third embodiment of the present invention;

FIG. 16 is a circuit diagram showing an example of the internal configuration of a VGATE generator 15 according to a fourth embodiment of the present invention;

FIG. 17 is a circuit diagram showing an example of the internal configuration of a voltage follower circuit 78;

FIG. 18 is a block diagram schematically showing the configuration of an LSI chip 85 incorporating the resistance-change-type fuse circuit according to one of the first to fourth embodiments;

FIG. 19 is a block diagram showing an example of the internal configuration of an SRAM section 86;

FIG. 20 is a circuit diagram showing an example of a portion 93 of the internal configuration corresponding to one bit in a redundancy information storing shift register 92;

FIG. 21 is a waveform diagram showing the operation at the time of programming of polysilicon fuses 5;

FIG. 22 is a waveform diagram showing the operation at the time of normal startup, i.e., when the states of polysilicon fuses 5 are read out;

FIG. 24 is a block diagram showing an example of the internal configuration of a VGATE selection circuit 111 shown in FIG. 23;

FIG. 27 is a circuit diagram showing an example of the internal configuration of a voltage follower circuit 129 shown in FIG. 26;

FIG. 28 is a diagram showing the relationship between an output signal PRGp<4:0> from a shift register 112 and selectively output voltage VGATE;

FIG. 29 is a diagram showing associations among the output signal PRGp<4:0> from the shift register 112, the polysilicon fuses 5 cut by trial cutting and the voltage VGATE at which trial cutting is performed;

FIG. 30 is a circuit diagram showing an example of the internal configuration of a VREF generator 117 shown in FIG. 24;

FIG. 31 is a diagram showing associations between the voltages VGATE at the time of trial cutting and the resistance values of the polysilicon fuses 5 after trial cutting;

FIG. 32 is a block diagram schematically showing the configuration of an LSI chip 85 incorporating the resistance-change-type fuse circuit 87a according to the sixth embodiment;

FIG. 35 is a waveform diagram showing the operation when redundancy data is programmed in the trial-cutting polysilicon fuses 121; and FIG. 36 is a waveform diagram showing the operation at the time of normal startup, i.e., transfer of the information programmed in the trial-cutting polysilicon fuses 121 to the SRAM section in the LSI chip 85.

Figure 23:
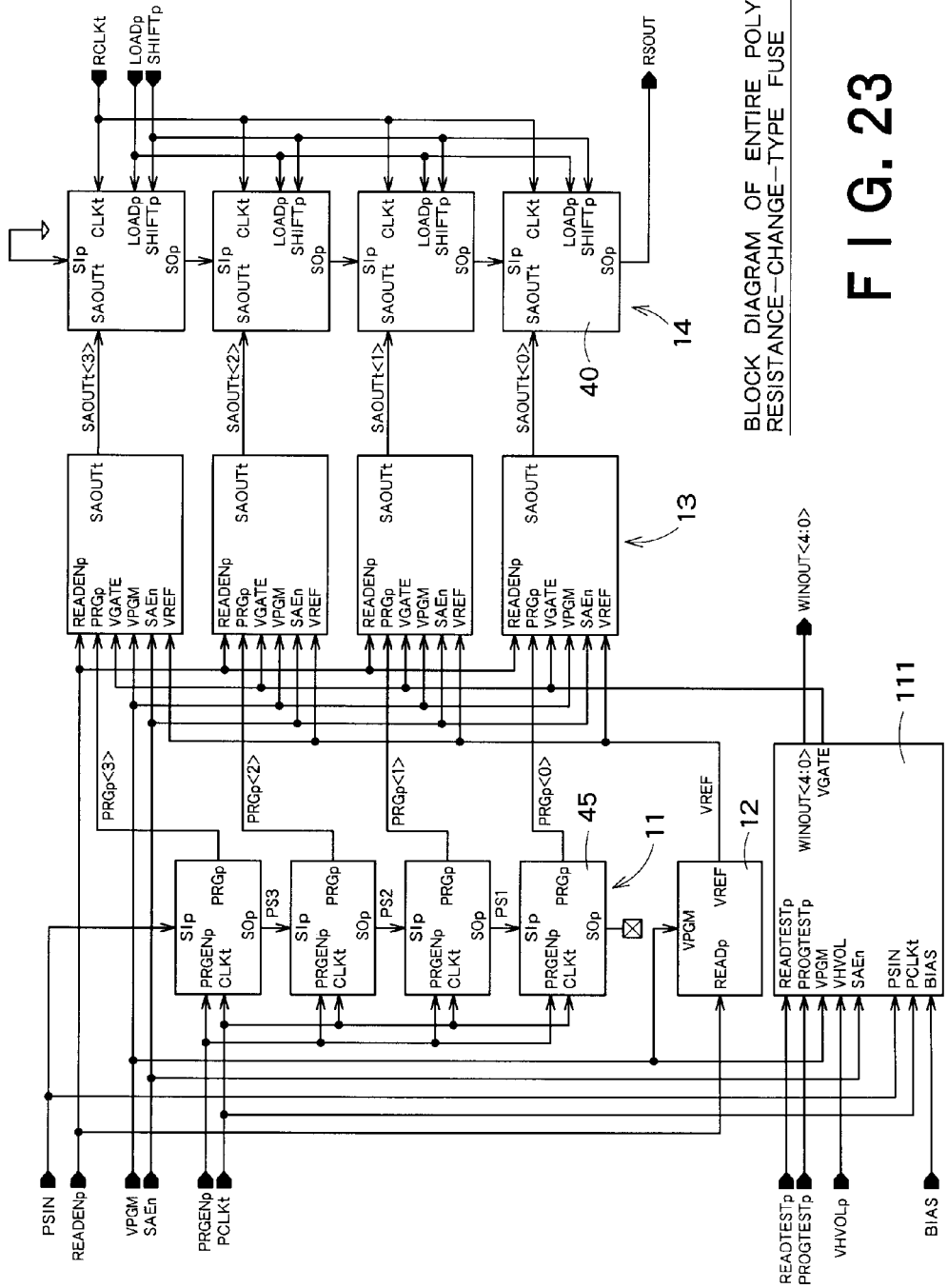
FIG. 23 is a block diagram showing the entire configuration of a resistance-change-type fuse circuit 87 according to a sixth embodiment of the present invention.

DETAILED DESCRIPTION OF THE INVENTION embodiments of the present invention will be described with reference to the accompanying drawings.

A polysilicon fuse controlled by a resistance-change-type fuse circuit of the present invention will first be described.

FIG. 1 is a perspective view schematically showing the structure of a polysilicon fuse. The polysilicon fuse shown in FIG. 1 has a salicide layer 2 formed on a polysilicon layer 1 and electrodes formed of a metal on the salicide layer 2 (anode 3 and cathode 4).

The polysilicon layer 1 shown in FIG. 1 is formed of the same material as polysilicon used for a gate electrode of an ordinary transistor, and also has the same sectional structure as the electrode. Therefore the polysilicon layer 1 shown in FIG. 1 can be formed in the process of forming a gate electrode of an ordinary transistor. There is no need for any special process step in forming the polysilicon layer 1. The polysilicon layer 1 shown in FIG. 1 is formed so that electrode portions are larger in width while a central portion between the electrode portions is smaller in width.

FIG. 2 is a diagram showing the connection relationship between a polysilicon fuse 5 and a programming NMOS transistor 6. A voltage VPGM on an external pad is supplied to the anode of the polysilicon fuse 5. The cathode of the polysilicon fuse 5 is connected to a drain electrode of the programming NMOS transistor 6.

A voltage VGATE is supplied to a gate electrode of the programming NMOS transistor 6. When a high voltage (e.g., 2.5 V) is supplied as a voltage VPGM while a voltage lower than the voltage VPGM (e.g., 1.5 V) is supplied as the voltage VGATE, the programming NMOS transistor 6 is turned on to cause a large current to flow through the polysilicon fuse 5 from the anode side to the cathode side.

FIG. 3 is a diagram showing a relationship between the current caused to flow through the polysilicon fuse 5 and the resistance value of the polysilicon fuse 5 after programming. When the programming NMOS transistor 6 is turned on to cause a large current larger than a predetermined amount to flow through the polysilicon fuse 5, an irreversible change occurs in the polysilicon fuse 5 to change the resistance value of the same. The changed resistance value is maintained even after shutting off the large current.

The resistance value of the polysilicon fuse 5 through which a large amount of current has flowed is either of two types explained as follows according to the current flowing through polysilicon.

When an extremely large current (Ia or larger in FIG. 3) is caused to flow, polysilicon generates heat from itself at a significantly high temperature according to the current-resistance product to blow out polysilicon. The resistance value after blowout is a high resistance Ra. The region of the relationship in this case will be referred to as a high-resistance region.

When a medium current (a current between Ib and Ia shown in FIG. 3) is caused to flow through the polysilicon fuse 5, electrons flow from the cathode side to the anode side, i.e., in the direction opposite to the direction of the current to cause an electromigration phenomenon, such that a substance contained in the salicide layer on polysilicon moves from the cathode side to the anode side by being forced by the electron flow. The region of the relationship in this case will be referred to as a medium-resistance region.

The central portion of the polysilicon layer in the polysilicon fuse 5 has a smaller width and a higher resistance value in comparison with the electrode portions. Accordingly, electromigration in the central portion progresses faster than that in the electrode portions. Therefore the amount of supply of atoms of the metal from the cathode side becomes deficient and a region lacking metal atoms is formed in the central portion in the vicinity of the cathode side, resulting in an increase in resistance value. The resistance value in this case is shown as a medium resistance Rb.

Since the polysilicon fuse 5 is provided for the purpose of causing an irreversible change in resistance by causing a current to flow through the polysilicon fuse 5, the purpose of data programming is achieved even in both of the high-resistance and medium-resistance regions shown in FIG. 3. However, when a large current Ia or more flows through the polysilicon fuse 5, a larger amount of heat is generated to damage not only the polysilicon fuse 5 but also portions surrounding the polysilicon fuse 5, reducing reliability of the semiconductor chip as a result.

When the above-described medium current is caused to flow through the polysilicon fuse 5, programming is performed by using electromigration, which is a comparatively slow phenomenon. In this case, therefore, the extent of damage to the surrounding portions is small and there is no risk of impairing the reliability of the semiconductor chip after programming.

For this reason, the phenomenon in which the polysilicon fuse 5 has a medium resistance as a result of causing the medium current to flow through the polysilicon fuse (hereinafter referred to as "medium-resistance mode") is utilized at the time of programming the polysilicon fuse 5. The medium-resistance mode has the advantage of ensuring the reliability of the semiconductor chip after programming but entails a drawback in that it is difficult to accurately control the current flowing through the polysilicon fuse 5 in the medium-resistance mode.

There are two methods for controlling the current flowing through the polysilicon fuse 5: one in which the voltage VPGM supplied to one end of the polysilicon fuse 5 is changed, and one in which the gate voltage VGATE of the programming NMOS transistor 6 is changed.

The operating point of the programming NMOS transistor 6 is changed by using a combination of these two voltages, thus enabling control of current Iprog flowing through the polysilicon fuse 5.

First Embodiment

In a first embodiment of the present invention described below, the gate potential VGATE of the programming NMOS transistor 6 is constantly maintained to reduce fluctuation in current flowing through the polysilicon fuse 5 at the time of programming.

FIG. 4 is a block diagram showing the entire configuration of a resistance-change-type fuse circuit according to the first embodiment of the present invention. The resistance-change-type fuse circuit shown in FIG. 4 has a programming shift register 11 which designates a polysilicon fuse 5 to be programmed, a VREF generator 12 which generates a reference potential, a plurality of fuse programming sense circuits 13 each of which generates a potential according to a current flowing through the corresponding one of polysilicon fuses 5, a readout shift register 14 which converts the potential outputs from the fuse programming sense circuits 13 into serial data and outputs the serial data, and a VGATE generator 15 which generates a potential VGATE used to program each polysilicon fuse 5.

Polysilicon fuses 5 to be programmed are provided in the fuse programming sense circuits 13. Programming of the polysilicon fuses 5 is performed only one time at the time of testing after manufacture of the semiconductor chip. Readout of programmed data is performed at the time of powering on and at the time of chip resetting even after shipping of the semiconductor chip.

FIG. 5 is a circuit diagram showing an example of the internal configuration of the fuse programming sense circuit 13. The fuse programming sense circuit 13 shown in FIG. 5 has a programming polysilicon fuse 5 and a programming NMOS transistor 6 connected in series between a terminal VPGM and a ground terminal, a level shifter 16 which generates a gate potential for the programming NMOS transistor 6, and a readout NMOS transistor 17 which reads out the state of the polysilicon fuse 5, and a sense amplifier 18 which generates a potential according to the current flowing through the polysilicon fuse 5.

The level shifter 16 shifts the level of a signal PRGp (=1) output from the programming shift register 11 shown in FIG. 4 to the potential VGATE. In this embodiment, the potential VPGM=2.5 V, and the potential VGATE=1.5 V. However, potentials different from these may alternatively be used.

FIG. 6 is a circuit diagram showing an example of the internal configuration of the level shifter 16. The level shifter 16 shown in FIG. 6 has a PMOS transistor 21 and an NMOS transistor 22 connected in series between a terminal VBP and a ground terminal, a PMOS transistor 23 and an NMOS transistor 24 also connected in series between the terminal VBP and the ground terminal, and a PMOS transistor 25 and an NMOS transistor 26 also connected in series between the terminal VBP and the ground terminal.

The PMOS transistors 21 and 23 and the NMOS transistors 22 and 24 constitute a differential amplifier, and the PMOS transistor 25 and the NMOS transistor 26 constitute an inverter.

The signal PRGp output from the programming shift register 11 shown in FIG. 4 is input to the gates of the NMOS transistors 22 and 24 via an inverter 27 or without being processed by the inverter 27, and a level-shifted potential is output from a connection node between the PMOS transistor 23 and the NMOS transistor 24.

When the signal PRGp is at low level, the NMOS transistor 24 is off and the output from the differential amplifier becomes high level. In this state, the output from the inverter constituted by the PMOS transistor 25 and the NMOS transistor 26, i.e., the output from the level shifter 16, is zero potential. When the signal PRGp is at high level, the NMOS transistor 24 is turned on and the output from the differential amplifier becomes low level. In this state, the output from the inverter, i.e., the output from the level shifter 16, is potential VGATE.

FIG. 7 is a circuit diagram showing an example of the internal configuration of the sense amplifier 18 shown in FIG. 5. The sense amplifier 18 shown in FIG. 7 includes a differential amplifier 38 having PMOS transistors 31 and 32 and NMOS transistors 33 to 37. This differential amplifier 38 compares an input potential IN with a reference potential VREF and outputs a potential according to the difference between the input potential IN and the reference potential VREF.

FIG. 8 is a circuit diagram showing an example of the internal configuration of the VGATE generator 15 shown in FIG. 1. The VGATE generator 15 shown in FIG. 8 has a dummy fuse group 41 and a dummy NMOS transistor 42 connected in series between an external IPGMIN terminal and a ground terminal. Voltage VGATE is output from a connection node between the dummy fuse group 41 and the dummy NMOS transistor 42.

The dummy fuse group 41 includes a plurality of polysilicon fuses 43 connected in series. The number of the plurality of polysilicon fuses 43 included in the dummy fuse group 41 and the form of connection of the polysilicon fuses 43 are not limited to those shown in FIG. 8, as described below.

The gate width of the dummy NMOS transistors 42 is set to $\frac{1}{10}$ of that of the programming NMOS transistor 6.

FIG. 9 is a circuit diagram showing an example of the internal configuration of each of shift registers 45 in the programming shift register 11 shown in FIG. 1. The register shown in FIG. 9 has clocked inverters 46 to 48, inverters 49 to 54, a transfer gate 55 and a NAND gate 56.

Serial data to be programmed are successively input to a SIp terminal of the programming shift register 11. The serial data are successively shifted by a clock signal CLKt and held in the registers 45.

The programming shift register 11 latches the data input to the SIp terminal by a rising edge of the clock signal CLKt when a program enable signal PRGENp is at high level, and outputs the data from a PRGp terminal.

FIG. 10 is a circuit diagram showing an example of the internal configuration of each of registers 40 in the readout shift register 14. The register shown in FIG. 10 has NAND gates 57 to 59, clocked inverters 60 to 62, inverters 63 to 65 and a transfer gate 66.

Output data SAOUT<0:3> from the fuse programming sense circuit 13 shown in FIG. 1 is input to the registers 40 in the readout shift register 14. When a load signal LOADp is at high level, the initial data SAOUT<0:3> is latched by a rising edge of the clock signal CLKt and output from a SOp terminal.

Also, when a shift signal SHIFTp is at high level, output SOp from the register 40 in the preceding stage is input to a SIp terminal and latched by a rising edge of the clock signal CLKt.

In a state where the load signal LOADp is at high level, output data SAOUT<0:3> from the fuse programming sense circuit 13 is taken into the registers 40 by a rising edge of the clock signal CLKt. Thereafter, upon arrival of three rising edges of the clock signal CLKt in a state where the load signal LOADp is at low level while the shift signal SHIFT is at high level, data SAOUT<0:3> is output as serial data from an output terminal RSOUT of the readout shift register.

FIG. 11 is a circuit diagram showing an example of the internal configuration of the VREF generator 12 shown in FIG. 1. The VREF generator 12 shown in FIG. 11 has a resistor group 71 and an NMOS transistor 72 connected in series between a terminal VPGM and a ground terminal. The resistor group 71 includes a plurality of (e.g., five) polysilicon fuses 73 connected in series.

The size of the NMOS transistor 72 is the same as that of the readout NMOS transistor 17 shown in FIG. 5. When a readout permission signal READp becomes high level at the time of readout, the readout NMOS transistor 17 becomes conductive and a current flows through the polysilicon fuses 5.

For example, the current flowing through the resistor group 71 and the NMOS transistor 72 is 0.5 mA, and the resistance of each polysilicon fuse 5 in the intact state is 100 ohms, the reference potential VREF is expressed by the following equation:

$$VREF = VPG - 5 \times R \times I$$
$$= 1.2\ V - 5 \times 100 \times 0.5\ mA$$
$$= 0.95\ V$$

The reference potential VREF generated by the VREF generator 12 is input to the sense amplifiers 18 in the fuse programming sense circuits 13 shown in FIG. 5.

The operation at the time of programming polysilicon fuses 5 will be described below by way of example with respect to a case where ten polysilicon fuses 5 are connected in series to form a dummy fuse group 41.

The fuse programming sensing circuit shown in FIG. 5 and the VGATE generator 15 shown in FIG. 8 form a current mirror circuit. FIG. 12 is an equivalent circuit diagram in which this current mirror circuit is represented by a current mirror circuit 75, and in which a switch equivalently represents the programming shift register 11.

If the resistance value of each polysilicon fuse 5 included in the dummy fuse group 41 is 100 ohms, the total resistance value is 1 kiloohms because ten polysilicon fuses 5 are connected in series. As mentioned above, the gate width of the dummy NMOS transistor 42 is 1/10 of the gate width of the programming NMOS transistor 6. Accordingly, a current ten times larger than the current flowing through the dummy NMOS transistor 42 flows through the programming NMOS transistor 6.

Before programming, a constant current (=1 mA) is caused to flow from a logic tester or the like (not shown) into the IPGMIN terminal shown in FIG. 1, and the potential appearing at the IPGMIN terminal when this constant current flows is measured. Since the 1 mA current flows through the polysilicon fuses 5 connected in series in the dummy fuse group 41, the potential VIPGMIN appearing at the IPGMIN terminal is expressed by the following equation:

$$VIPGMIN = VGATE + 1\ mA \times 1\ k\Omega$$
$$= VGATE + 1\ V$$

For example, the potential VGATE is assumed to be 1.5 V. In this case, the potential at the IPGMIN terminal is 2.5 V. A potential equal to or higher than that at the IPGMIN terminal (e.g., 2.5 V) is applied to the VPGM terminal. To a PSIN terminal shown in FIG. 4, a serial data string to be programmed is supplied in synchronization with a clock signal PCLKt. If, for example, a serial data string "0100" is supplied to the PSIN terminal, only the output signal PRGp from the resister next to the lowermost one in the four registers in the programming shift register 11 becomes high level and the other signals PRGp are at low level.

Since the potential of the signal PRGp when the signal PRGp is at high level is produced from the power supply potential VDD, the potential at the PRGp terminal when the signal PRGp is at high level is VDD (e.g., 1.2 V).

The potential at the PRGp terminal is input to the level shifter 16 to be level shifted to the potential VGATE.

Since the output terminal of the level shifter 16 is connected to the gate terminal of the programming NMOS transistor 6, the gate potential of the programming NMOS transistor 6 becomes equal to VGATE when the signal PRGp is at high level.

A potential of 2.5 or higher is applied to the terminal VPGM. If the potential VPGM=2.5 V, the programming NMOS transistor 6 permits a current (=10 mA) 10 times higher than the current flowing through the dummy NMOS transistor 42 to flow therethrough because the gate width of the programming NMOS transistor 6 is 10 times larger than the gate width of the dummy NMOS transistor 42.

If the resistance of the polysilicon fuse 5 is 100 ohms and if a current of 10 mA flows through the programming polysilicon fuse 5, the potential drop across the polysilicon fuse 5 is 100Ω×10 mA=1 V.

Since the relationship of potential VPGM=VIPGMIN=VGATE+1 V is established, the potential at a connection node FUSENODE between the polysilicon fuse 5 and the programming NMOS transistor 6 is equal to the potential VGATE.

FIG. 13 is a diagram collectively showing the bias potential relationship between the dummy NMOS transistor 42 in the VGATE generator 15 and the programming NMOS transistor 6.

If the gate potentials of the dummy NMOS transistor 42 and the programming NMOS transistor 6 are equal to each other, the ratio of the currents flowing through these transistors is equal to the ratio of the gate widths of these transistors, as shown in FIG. 13. Since the gate width of the programming NMOS transistor 6 is 10 times larger than that of the dummy NMOS transistor 42, a current 10 times larger than the current flowing through the dummy NMOS transistor 42 flows through the programming NMOS transistor 6.

Even in a case where a potential of 2.5 V or higher is applied to the terminal VPGM, it is ensured that the programming NMOS transistor 6 operates in the saturation region. Also, the current flowing through the programming NMOS transistor 6 does not largely depend on the potential VPGM.

Therefore it can be supposed that a current of about 10 mA flows through the programming NMOS transistor 6.

Thus, in the first embodiment, the dummy fuse group 41 and the dummy NMOS transistor 42 are provided as the VGATE generator 15 for generating the gate potential VGATE for the programming NMOS transistor 6, and a current n times (e.g., 10 times) larger than the current flowing through the dummy NMOS transistor 42 is caused to flow through the programming NMOS transistor 6 at all times. As a result, the current flowing through the programming NMOS transistor 6 is stabilized so as to be able to program the polysilicon fuse 5 constantly with optimum current.

In this embodiment, to realize such an operation, the dummy fuse group 41, the dummy NMOS transistor 42, the programming polysilicon fuse 5 and the programming NMOS transistor 6 are included in the current mirror circuit 75 to cause a current n times larger than the current flowing through the dummy NMOS transistor 42 to flow through the programming transistor.

In the current mirror circuit 75 thus formed, a large current necessary for programming flows through the programming polysilicon fuse 5 but the current flowing through the dummy fuse group 41 is only 1/n of the current flowing through the programming polysilicon fuse 5. Therefore there is no risk in which the current as much as the resistance value changes of the dummy fuse group 41 flows through the dummy fuse group 41, so that the VGATE generator 15 can be reused.

Thus, according to the first embodiment, there is no need to provide any polysilicon fuse for trial cutting, and the overall size of the resistance-change-type fuse circuit can be reduced.

Second Embodiment

A second embodiment of the present invention is characterized in that the internal configuration of a VGATE generator 15 differs from that in the first embodiment.

FIG. 14 is a circuit diagram showing the internal configuration of the VGATE generator 15 according to the second embodiment. The VGATE generator 15 shown in FIG. 14 has a dummy fuse group 41a. The internal configuration of the dummy fuse group 41a is different from that of FIG. 8. The dummy fuse group 41a shown in FIG. 14 is formed by connecting twenty pairs of polysilicon fuses 5 in series. The dummy fuse group 41a shown in FIG. 14 has twenty parallel fuse strings connected in series, each of which has two polysilicon fuses connected in parallel.

If the resistance value of each polysilicon fuse 5 including the dummy fuse group 41a is 100 ohms, the resistance value of each pair of polysilicon fuses 5 connected in parallel with each other is 50 ohms. Accordingly, the entire dummy fuse group 41a equivalently has a resistance value of 1 kiloohms.

The VGATE generator 15 shown in FIG. 14 requires a number of polysilicon fuses 5 which is quadruple to that required by the VGATE generator 15 shown in FIG. 8, but the current flowing through the dummy fuse group 41a and the dummy NMOS transistor 42 is half that in the VGATE generator 15 shown in FIG. 8. Accordingly, the risk of occurrence of irreversible change in resistance of each fuse in the dummy fuse group 41a is further reduced, thereby improving the reliability of the dummy fuse group 41a.

Thus, in the second embodiment, the current flowing through the dummy fuse group 41a in the VGATE generator 15 can be further reduced, thereby reducing the possibility of occurrence of a change in resistance of the row of dummy fuses at the time of programming.

Third Embodiment

A third embodiment of the present invention is characterized by having a VGATE generator circuit differing in internal configuration from those in the first and second embodiments.

FIG. 15 is a circuit diagram showing the internal configuration of the VGATE generator 15 according to the third embodiment. The VGATE generator 15 shown in FIG. 15 differs from those shown in FIGS. 8 and 14 in having a dummy transistor group 77 formed of a plurality of dummy NMOS transistors 42. The dummy transistor group 77 has two NMOS transistors 42a and 42b connected in series between the terminal VGATE and the ground terminal and two NMOS transistors 42c and 42d also connected in series between the terminal VGATE and the ground terminal.

The gate width of each of these four NMOS transistors is 1/10 of the gate width of the programming NMOS transistor 6. Accordingly, the equivalent gate width of the dummy transistor group 77 is the same as the gate width of the dummy NMOS transistors 42 shown in FIGS. 8 and 15.

In comparison with the first embodiment, the dummy transistor group 77 shown in FIG. 15 has a quadruple number of dummy NMOS transistors 42. However, fluctuation in the current flowing through the dummy transistor group 77 is reduced relative to that in the dummy NMOS transistor 42 shown in FIG. 8, because fluctuation in the transistor is proportional to the reciprocal of the gate area of the transistor. That is, fluctuation is reduced to half if the gate area is quadrupled.

Thus, in the third embodiment, the dummy transistor group 77 is connected to the dummy fuse group 41 to reduce fluctuation in the current flowing through the dummy fuse group 41, thereby reducing fluctuation in the programming current flowing through the programming polysilicon fuse 5.

Fourth Embodiment

A fourth embodiment of the present invention is characterized by providing a voltage follower circuit in the VGATE generator 15.

FIG. 16 is a circuit diagram showing the internal configuration of the VGATE generator 15 according to the fourth embodiment. The VGATE generator 15 shown in FIG. 16 differs from that shown in FIG. 8 in that a voltage follower circuit 78 is connected to the connection node between the dummy fuse group 41 and the dummy NMOS transistor 42. The voltage follower circuit 78 outputs a potential as VGATE.

The voltage follower circuit 78 performs the function of increasing the input impedance while reducing the output impedance. FIG. 17 is a circuit diagram showing an example of the internal configuration of the voltage follower circuit 78. The voltage follower circuit 78 shown in FIG. 17 is configured by a differential amplifier having PMOS transistors 79 and 80 and NMOS transistors 81 to 83.

The provision of the voltage follower circuit 78 ensures that the potential VGATE does not change easily even when the load connected to the output terminal of the VGATE generator 15 varies to some degree. Accordingly, fluctuation in the current flowing through the programming polysilicon fuse 5 can also be reduced.

Fifth Embodiment

FIG. 18 is a block diagram schematically showing the configuration of an LSI chip 85 incorporating the resistance-change-type fuse circuit in one of the above-described first to fourth embodiments. The LSI chip 85 shown in FIG. 18 has a static random access memory (SRAM) section 86, a resistance-change-type fuse circuit 87 corresponding to the resistance-change-type fuse circuit shown in FIG. 4, a fuse control circuit 88 which generates various signals for controlling the SRAM section 86 and the resistance-change-type fuse circuit 87, and a logic circuit 89 which performs some other processing.

While an example of incorporation of an SRAM as a memory has been shown in FIG. 18, any other kind of memory, e.g., a DRAM or a flash memory may alternatively be incorporated, or no memory may be incorporated.

FIG. 19 is a block diagram showing an example of the internal configuration of the SRAM section 86. The SRAM section 86 has an SRAM cell array 91 incorporating a redundant cell array, and a redundancy information storing shift register 92 for storing redundancy information.

With respect to the example shown in FIG. 19, it is assumed that redundancy information for control of the SRAM cell array 91 is 4-bit data, and that the 4-bit redundancy data is held in a 4-bit shift register.

FIG. 20 is a circuit diagram showing an example of the internal configuration corresponding to one bit part 93 in the redundancy information storing shift register 92. The shift register 93 shown in FIG. 20 has clocked inverters 94 to 96, inverters 97 to 102, a NAND gate 103 and a transfer gate 104, and shifts data by one bit at each rising edge of the clock signal CLKt. When an enable signal ENp is at high level, data stored in the shift register is output from a terminal RDDATAp.

The resistance-change-type fuse circuit 87 described in the description of the first to fourth embodiments is controlled by the fuse control circuit 88 shown in FIG. 18. The fuse control circuit 88 generates various control signals for enabling the resistance-change-type fuse circuit 87 to operate by suitable timing. The internal configuration of the fuse control circuit 88 is not particularly specified. Therefore the fuse control circuit 88 will not be descried in detail in this specification.

FIGS. 21 and 22 are operating waveform diagrams showing various control signals generated by the fuse control circuit 88. FIG. 21 is an operating waveform diagram for explaining programming of polysilicon fuses 5, and FIG. 22 is an operating waveform diagram for explaining normal startup, i.e., readout of the states of the polysilicon fuses 5.

Referring to FIG. 21, a PSIN signal is input to the PSIN terminal in synchronization of rising edges of the PCLKt signal for serial input of data for programming of the polysilicon fuses 5. Since the redundancy information for the SRAM is 4-bit information as mentioned above, four pulses of the PCLKt signal are input and 4-bit data is serially input from the PSIN terminal in synchronization with the rising edges of the PCLKt signal.

An IPGMIN signal is a constant-current signal necessary for generating the potential VGATE. In this embodiment, a current of 1 mA is caused to flow in as the IPGMIN signal.

The potential VPGM is the power supply potential used to cause the programming current through each polysilicon fuse 5. A potential IPGMIN when a current of 1 mA is caused to flow in by the IPGMIN signal is recorded and a potential equal to the potential IPGMIN is supplied from the terminal VPGM.

The above-described control makes it possible to cause a current precisely set to 1 mA to flow in at the time of programming of the polysilicon fuses 5.

In this embodiment, potential VPGM=2.5 V is applied by assuming that the potential appearing at the IPGMIN terminal when 1 mA IPGMIN signal is caused to flow in is 2.5 V. After the current caused to flow into the IPGMIN terminal and the potential applied to the terminal VPGM have been stabilized, the PRGENp signal is set to high level. The polysilicon fuse 5 corresponding to the bit "1" input from the PSIN terminal is thereby programmed.

When the states of the polysilicon fuses 5 are read out, the PRGENp signal, PSIN signal and PCLKt signal used for programming are fixed at low level, as shown in FIG. 22. Also, signal IPGMIN is grounded so that the current does not flow.

The potential VPGM is used at the time of readout from the polysilicon fuses 5 as a power supply for causing a weak current small enough to avoid programming in each polysilicon fuse 5 to flow into the polysilicon fuse 5. Therefore a potential of 1.2 V equal to the power supply potential is supplied as the potential VPGM.

When a READENp signal is set to high level after powering on, a current flows through the polysilicon fuse 5 and the VREF generator 12. This current is set to a such a current value that the fuse is not programmed. For example, it is assumed that when the potential VPGM is 1.2 V, a current of 0.5 mA flows into the polysilicon fuse 5 and the VREF generator 12.

Five dummy fuses made of the same material and having the same size as the fuse are connected in series to the VREF generator 12. The dummy fuses function as a resistor. If the resistance value of the dummy fuses is Rc, a potential shown below appears at the VREF terminal.

$$VREF=VPGM-5 \times Rc \times I=1.2V-5 \times Rc \times 0.5 \text{ mA}$$

Accordingly, a current of 0.5 mA also flows on the polysilicon fuse 5 side. The intact fuse has a resistance value Rc, while the programmed fuse has a resistance value Rb (>5Rc). Therefore, a potential shown by 1.2 V−Rc×0.5 mA (>VREF) appears at the FUSENODE terminal of the intact fuse, while a potential shown by 1.2V31 Rb×0.5 mA (<VREF) appears at the FUSENODE terminal of the programmed fuse.

This potential is compared with the above-described potential VREF. When a SAEn signal becomes low, the readout sense amplifier 18 is activated to output the result of comparison between the FUSENODE terminal and the VREF terminal to the output terminal SAOUT of the fuse programming sense amplifier 13 shown in FIG. 5.

The SAOUT signal is taken into the readout shift register 14 shown in FIG. 4 when the LOADp signal is at high level. The SHIFTp signal is a signal for permitting the shift register to perform the shifting operation. The readout shift register 14 shifts by one bit each time a clock pulse of the RCLKt signal is input during the period in which the SHIFTp signal is at high level. By seven pulses of the RCLKt signal, all the results of readout from the polysilicon fuses 5 are transferred to the redundancy information storage register in the SRAM section 86. After the completion of transfer, the RDENp signal is set to high level to supply the redundancy information to the SRAM cell array 91.

Thus, in the fifth embodiment, the resistance-change-type fuse circuit 87 according to the first to fourth embodiments and the SRAM section 86 are integrated, thereby easily and reliably replacing defective SRAM cells with redundant cells.

Sixth Embodiment

A sixth embodiment of the present invention described below is characterized in that an optimum programming current is supplied to programming polysilicon fuses 5.

FIG. 23 is a block diagram showing the entire configuration of a resistance-change-type fuse circuit 87 according to the sixth embodiment of the present invention. In FIG. 23, the same components as those in the circuit shown in FIG. 4 are indicated by the same reference characters. The following description is made mainly of points of difference from the above-described circuit.

The resistance-change-type fuse circuit 87a shown in FIG. 23 has a VGATE selection circuit 111 as a component not existing in the circuit shown in FIG. 4. This VGATE selection circuit 111 selects an optimum potential as VGATE from a plurality of potentials.

FIG. 24 is a block diagram showing an example of the internal configuration of the VGATE selection circuit 111 shown in FIG. 23. The VGATE selection circuit 111 shown in FIG. 24 performs programming by applying different potentials to five trial-cutting polysilicon fuses, checks whether the resistances of the trial-cutting polysilicon fuses after programming are within the medium resistance region Rb±Rd, and selects the potential VGATE most suitable for programming the programming polysilicon fuse 5.

The VGATE selection circuit 111 shown in FIG. 24 has a 5-bit trial-cutting shift register 112, selection control circuits 113 which generate a selection control signal for selection from the trial-cutting polysilicon fuses, trial-cutting fuse circuits 114, trial-cutting sense amplifiers 115 which sense output signals from the trial-cutting fuse circuits 114, a VGATE generator 116 which generates five different potentials VGATE, and a trial-cutting VREF generator 117 which generates a reference potential VREF to be supplied to the trial-cutting sense amplifiers 115. The selection control circuits 113, the trial-cutting fuse circuits 114 and the trial-cutting sense amplifier 115 are provided in correspondence with registers in the trial-cutting shift register 112. The number of circuits of each kind provided in the example shown in FIG. 24 is five.

Figure 25:
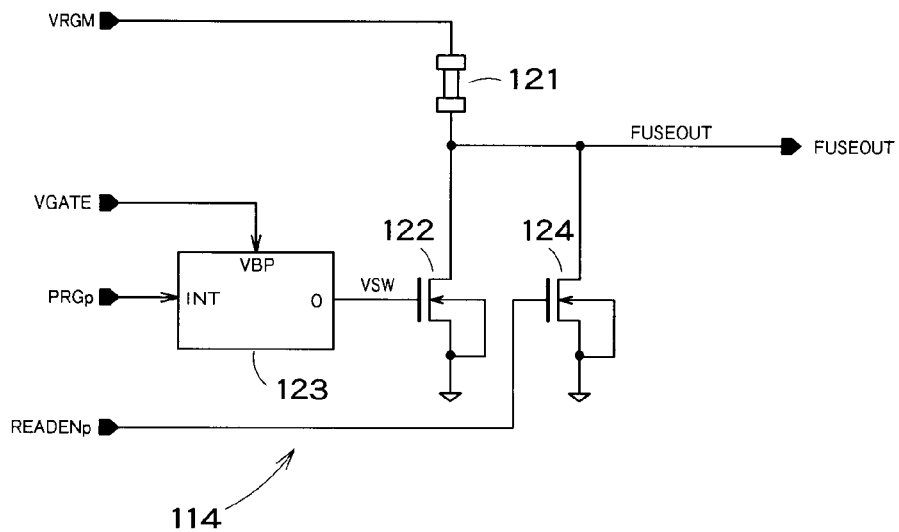
FIG. 25 is a circuit diagram showing an example of the internal configuration of a trial-cutting fuse circuit 114.

FIG. 25 is a circuit diagram showing an example of the internal configuration of the trial-cutting fuse circuit 114. The trial-cutting fuse circuit 114 shown in FIG. 25 has a trial-cutting polysilicon fuse 121 and a programming NMOS transistor 122 connected in series between a terminal VPGM and a ground terminal, a level shifter 123 which supplies a gate potential to the programming NMOS transistor 122, and a readout NMOS transistor 124 connected between an output terminal and a ground terminal.

Figure 26:
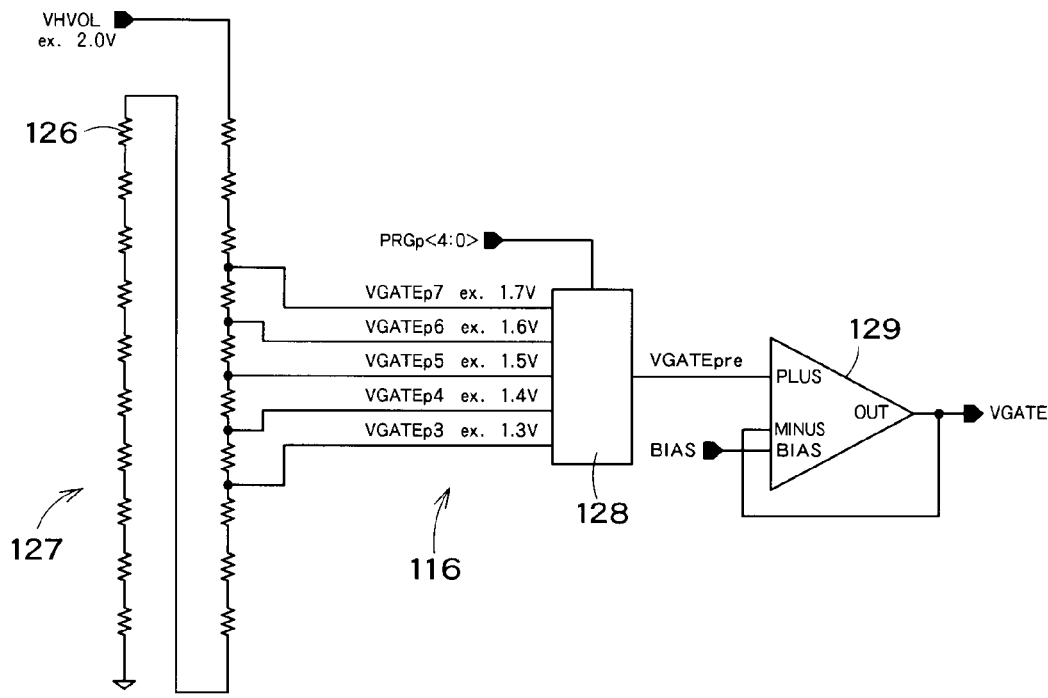
FIG. 26 is a circuit diagram showing an example of the internal configuration of a VGATE generator 116.

FIG. 26 is a circuit diagram showing an example of the internal configuration of the VGATE generator 116 which has a register array 127 formed of twenty registers 126 connected in series between a terminal VHVOL and a ground terminal, a selector 128 which selects one of five potentials output from the resistor array 127 on the basis of a signal PRCp, and a voltage follower circuit 129 which performs impedance conversion of a signal output from the selector 128.

FIG. 27 is a circuit diagram showing an example of the internal configuration of the voltage follower circuit 129 shown in FIG. 26. The internal configuration of the voltage follower circuit 129 is substantially the same as that described above with reference to FIG. 17.

The procedure of processing for programming trial-cutting polysilicon fuses 121 will be described. First, before trial cutting, a potential VPGM=2.5 V and a potential VHOL=2.0 V are supplied from an external logic tester. A data sequence for trial cutting is serially transferred from the PSIN terminal to the trial-cutting shift register 112 in synchronization with the clock signal PCLKt.

Trial cutting is performed on a bit-by-bit basis on the trial-cutting polysilicon fuses 121 for five bits. "1" is first written to the 0th register (the register in the lowermost position in FIG. 24), while "0" is written to the other registers. When the program enable signal PRGENp is set to high level, and if the data held in the trial-cutting shift register 112 is "1" indicating the execution of programming, the signal PRGp<0> output from the register becomes high level. When a trial-cutting enable signal PROGTESTp is thereafter set to high level, the input terminal PRGp of the 0th trial-cutting polysilicon fuse 121 becomes high level.

When the terminal PRGp becomes high level, the gate potential of the programming NMOS transistor 122 becomes the VGATE level and the programming NMOS transistor 122 is turned on to cause a current to flow through the trial-cutting polysilicon fuse 121.

In the VGATE generator 116 shown in FIG. 26, the potential (=2.0 V) between the terminal VHVOL and the ground terminal is divided by the twenty resistors 126 and, therefore, potentials differing one from another by 0.1 V appear between taps from points between the resistors. More specifically, five potentials: 1.3 V, 1.4 V, 1.5 V, 1.6 V, and 1.7 V are input to the selector 128. The selector 128 selects one of these five potentials according to the logic of a signal PRGp<4:0> and outputs the selected potential from a terminal VGATEpre.

The potential VGATEpre is impedance-converted by the voltage follower circuit 129 to be output as VGATE.

The relationship between the output signal PRGp<4:0> from the shift register 112 and the potential VGATE selectively output is as shown in FIG. 28.

The potential VGATE output from the VGATE generator 116 is supplied to each of terminals VGATE of the five trial-cutting polysilicon fuse circuits 114 shown in FIG. 24. Accordingly, the five trial-cutting polysilicon fuses 121 are respectively cut by different potentials VGATE for trial cutting.

FIG. 29 is a diagram showing associations among the output signal PRGp<4:0> from the shift register 112, the polysilicon fuses 5 cut by trial cutting and the potential VGATE at which trial cutting is performed.

It is assumed here that the potential VGATE most suitable for the polysilicon fuse 5 is 1.5 V, and that when the potential VGATE=1.5 V is applied to the gate of the programming NMOS transistor 122, the current Ic most suitable for the trial-cutting polysilicon fuse 121 flows and the resistance after programming is Rb.

When the potential VGATE is 1.4 V, lower by 0.1 V than 1.5 V, current Ib flows through the trial-cutting polysilicon fuse 121 and the resistance after programming barely reaches Rb.

Conversely, when the potential VGATE is 1.6 V higher by 0.1 V than 1.5 V, current Ia flows through the trial-cutting polysilicon fuse 121 and the resistance after programming barely reaches Rb.

When the potential VGATE is 1.3 V, the current flowing through the trial-cutting polysilicon fuse 121 is smaller than Ib and the resistance after programming is the same as the initial value Rc. When the potential VGATE is 1.7 V, the current flowing through the trial-cutting polysilicon fuse 121 is equal to or larger than Ia and the resistance after programming is equal to or higher than Ra.

FIG. 30 is a circuit diagram showing an example of the internal configuration of the VREF generator 117 shown in FIG. 24. The VREF generator 117 shown in FIG. 30 has a group of trial-cutting fuses 131 connected in series between an external terminal VPGM and a ground terminal and a dummy readout NMOS transistor 132.

The trial-cutting fuse group 131 has twelve trial-cutting polysilicon fuses 5 connected in series. The dummy readout NMOS transistor 132 is equal in size to the readout NMOS transistor 124.

When the dummy readout NMOS transistor 132 is turned on, a current flows from the external terminal VPGM to the ground terminal. From the tap corresponding to a reduction in resistance by (Rb−Rd) from the external terminal VPGM, a divided potential VREF1 is output. From the tap corresponding to a reduction in resistance by (Rb+Rd) from the external terminal VPGM, a divided potential VREF2 is output.

The potential VREF1 is equal to the potential appearing on the terminal FUSENODE when the resistance of the trial-cutting polysilicon fuse 121 becomes equal to (Rb−Rd). The potential VREF2 is equal to the potential appearing on the terminal FUSENODE when the resistance of the trial-cutting polysilicon fuse 121 becomes equal to (Rb+Rd).

After the completion of trial cutting of the trial cutting polysilicon fuses 121 for five bits, a signal READTESTAp shown in FIG. 24 is set to high level to check the resistance values of the fuses after the trial cutting. The potential VREF1 and the potential VREF2 are then generated from the VREF generator 117. These potentials are output from the VREF generator 117 as reference potentials for the readout sense amplifier 18.

Two trial-cutting sense amplifiers 115 are provided in correspondence with each of the trial-cutting polysilicon fuses 121. One of the two trial-cutting sense amplifiers 115 compares the signal FUSENODE and the potential VREF1, while the other compares the signal FUSENODE and the potential VREF2.

When a sense amplifier 18 activating signal SAEn is set to low level, the trial-cutting sense amplifiers 115 operate and the comparison results appear on terminals ASOUT1<4:0> and terminals SAOUT2<4:0>.

It can be understood that in the circuit shown in FIG. 24 an output signal WINOUT<4:0> from the VGATE selection circuit 111 becomes high level when the potential appearing on the FUSENODE terminal <4:0> satisfies a relationship of VREF1<FUSENODE<VREF2. When this relationship is expressed by using the resistance value of the polysilicon fuses 5, WINOUT<4:0> becomes high level when a relationship of (Rb−Rd) <the resistance value of polysilicon fuse 5 after programming <(Rb+Rd) is satisfied.

FIG. 31 is a diagram showing associations between the potentials VGATE at the time of trial cutting and the resistance values of the polysilicon fuses 5 after trial cutting. The output signal WINOUT<4:0> from the VGATE selection circuit 111 is read out with an external tester. If the value of the signal is "01110" for example, it can be determined that VGATE=1.5 V, which is a middle value of the value expressed by these bits is the optimum potential VGATE.

If the output PRGp<2> from the shift register 112 in the VGATE selection circuit 111 is set to high level when the programming polysilicon fuses 5 are programmed, potential VGATE=1.5 V is obtained and programming may be performed by using this potential VGATE.

In the sixth embodiment, as described above, a plurality of trial-cutting polysilicon fuses 121 to be programmed by different potentials VGATE are provided, the resistances of the trial-cutting polysilicon fuses after trial cutting are checked, and the optimum potential VGATE for programming the programming polysilicon fuses 5 is selected. Thus, the programming polysilicon fuses 5 can be programmed by the optimum current at all times.

Seventh Embodiment

FIG. 32 is a block diagram schematically showing the configuration of an LSI chip 85 incorporating the above-described resistance-change-type fuse circuit 87a according to the sixth embodiment. The configuration of the LSI chip 85 shown in FIG. 32 is basically the same as that shown in FIG. 18. However, an internal configuration of the resistance-change-type fuse circuit 87a and timing of a fuse control circuit 88a in the LSI chip 85 differ from those in the above-described LSI chip 85. The SRAM section 86 in the LSI chip 85 shown in FIG. 32 has the internal configuration shown in FIG. 19.

Figure 33:
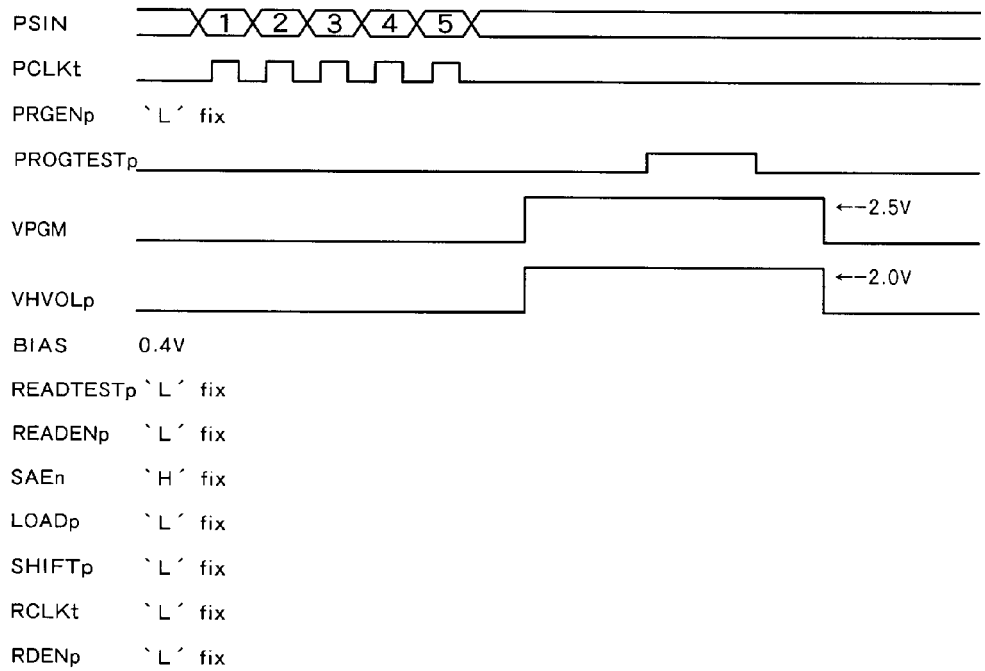
FIG. 33 is a waveform diagram showing the operation at the time of trial cutting of polysilicon fuses 121.

FIG. 33 is a waveform diagram showing the operation at the time of trial cutting of polysilicon fuses 121. In this example, five polysilicon fuses 121 are provided. Programming is performed by applying potentials VGATE different slightly from each other to the gates of the corresponding programming NMOS transistors 122, and the optimum potential VGATE is thereafter selected.

Data "10000" is first input serially from the PSIN terminal in synchronization with the signal PCLKt. After serial input of this 5-bit data is completed, 2.5 V is applied to the terminal VPGM, 2 V is applied to the terminal VHVOLp, and the terminal PROGTESTp is set to high level.

The potential VGATE=1.3 V is thereby output from the VGATE generator shown in FIG. 24 to be supplied to the trial-cutting polysilicon fuses 121. "1" is held in the register in the lowermost position in the programming shift register 112 in FIG. 24, while "0" is held in the other registers. Accordingly, the output PROGp<0> from the lowermost register is high level and the corresponding trial-cutting polysilicon fuse 121 is programmed.

The same sequence of operations is repeated five times by shifting bit "1" from one place to another as shown by "10000"→"010000"→"00100". The five trial-cutting polysilicon fuses 121 are thereby programmed by VGATE=1.3 V, 1.4 V, 1.5 V, 1.6 V, and 1.7 V in order from the top.

Figure 34:
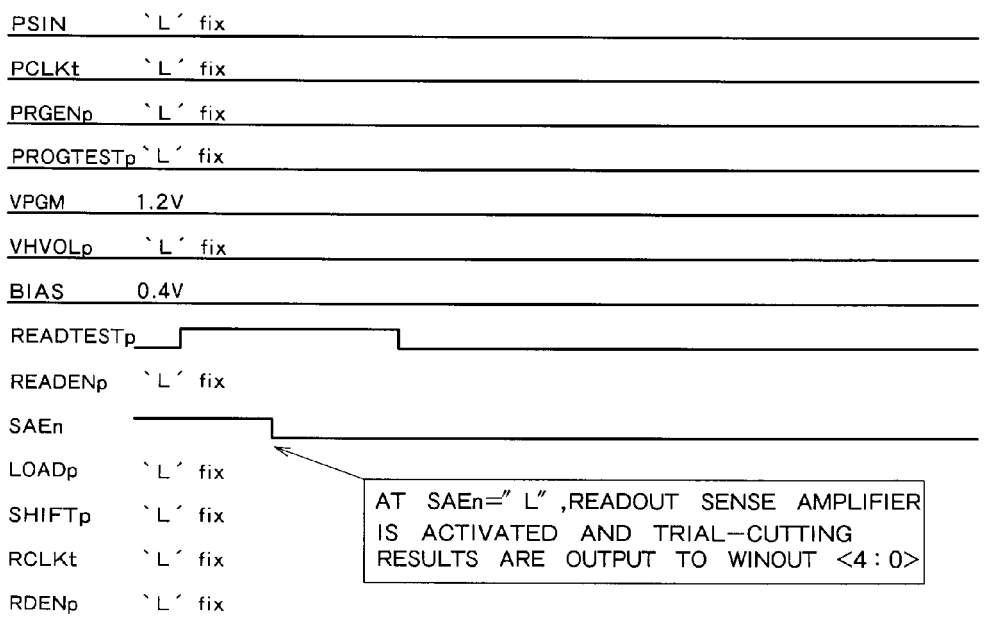
FIG. 34 is a waveform diagram showing the operation at the time of determination of the voltage VGATE.

FIG. 34 is a waveform diagram showing the operation at the time of determination of the potential VGATE. When the signal READTESTp shown in FIG. 24 is set to high level, the potential at the VREF1 terminal and the potential at the VREF2 terminal output from the VREF generator 117 are as shown below.

$$VREF1=VPGM-8 \times R \times I$$

$$VREF2=VPGM-12 \times R \times I$$

If VPGM=1.2 V; the resistance R of the trial-cutting fuse group 131 shown in FIG. 30 is 100 ohms; and the current flowing through the trial-cutting fuse group 131 is 0.5 mA, the potential VREF1=0.8 V and VREF2=0.6 V are obtained.

A current of 0.5 mA also flows through the trial-cutting polysilicon fuse 121, so that the output FUSEOUT from the trial-cutting fuse circuit 87a is FUSEOUT=VPGM−R×I.

It is assumed here that VPGM=1.2 V and I=0.5 mA. When the signal SAEn becomes low level, the result of comparison of the output potentials FUSEOUT from the trial-cutting fuse circuits 114 with VREF1 and VREF2 are output from the output terminal WINOUT<4:0>.

If the resistance value of the polysilicon fuse 5 is within the range from Rb−Rd to Rb+Rd, the WINOUTp is "1". If the resistance value is not within this range, the WINOUTp is "0".

For example, a case where WINOUT<4:0>="01110" is assumed. In this case, when the VGATE is in the range from 1.4 V to 1.6 V, the resistance value of the polysilicon fuse 5 after trial cutting is within the range from Rb−Rd to Rb+Rd, and it can be determined that the most suitable VGATE value is 1.5 V. This corresponds to the case of writing "00100" to the programming shift register 112.

FIG. 35 is a waveform diagram showing the operation when redundancy data is programmed in the trial-cutting polysilicon fuses 121. The PSIN terminal is a terminal through which data to be programmed in the trial-cutting polysilicon fuses 121 is serially input in synchronization with rising edges of the clock signal PCLKt.

Since the redundancy information for the SRAM is 4-bit data, four clock pulses of the signal PCLKt are input and the 4-bit data is serially input to the PSIN terminal in synchronization with rising edges of the signal PCLKt.

When the signal PGENp is set to high level after the potential at the terminal VPGM for causing the programming current to flow through the trial-cutting polysilicon fuses 121 has been stabilized, the fuse corresponding to the data bit "1" input from the PSIN terminal is programmed.

FIG. 36 is a waveform diagram showing the operation at the time of normal startup, i.e., transfer of the information programmed in the trial-cutting polysilicon fuses 121 to the SRAM section in the LSI chip 85. The signal PRGENp, the signal PSIN and the signal PCLKt are fixed at low level, and a signal IPGMIN is grounded so than the current does not flow.

The potential VPGM is set to 1.2V equal to the power supply, because the VPGM is used at the time of readout from the trial-cutting polysilicon fuses 121 as a power supply for flowing a weak current as much as the fuses 121 are not programmed.

The operation timing at the time of normal startup is the same as that shown in FIG. 22, and the detailed description of it will not be repeated.

In the seventh embodiment, as described above, the resistance-change-type fuse circuit 87a according to the sixth embodiment and the SRAM section 86 are integrated, thereby easily and reliably replacing the defective SRAM cells with the redundant cells.

What is claimed is:

1. A resistance-change-type fuse circuit, comprising:
a plurality of polysilicon fuses which are made of polysilicon and causes irreversible change in resistance by flowing a current;
a plurality of programming transistors which are provided corresponding to the plurality of fuses, each programming transistor switching whether to flow the current through the corresponding fuse to cause change in resistance with respect to the polysilicon fuses;
a dummy fuse group including a plurality of dummy fuses having the same electrical properties as that of the polysilicon fuses, each dummy fuse having 1/n (n is an integer equal to or more than 1) times a resistance of the polysilicon fuses;
a dummy transistor circuit which has at least one of dummy transistor having 1/n times a conductance of the programming transistors, a gate and a drain of the dummy transistor being connected to each other; and
a current mirror circuit including the programming transistor and the dummy transistor, the current mirror circuit causing each polysilicon fuse to flow n times the current flowing through the dummy fuse group.

2. The resistance-change-type fuse circuit according to claim 1, further comprising:
a plurality of program information setting section provided corresponding to the plurality of programming transistors, each program information setting section setting information indicative of causing irreversible change in resistance with respect to the polysilicon fuse corresponding to the programming transistor,
wherein the current mirror circuit flows the current through the corresponding polysilicon fuse when the information is set to at least one of the plurality of program information setting section.

3. The resistance-change-type fuse circuit according to claim 1,
wherein the dummy fuse group has the plurality of dummy fuses connected in series.

4. The resistance-change-type fuse circuit according to claim 1,
wherein the dummy fuse group has the plurality of dummy fuses connected in series and parallel.

5. The resistance-change-type fuse circuit according to claim 1,
wherein the dummy transistor circuit has a plurality of dummy transistors connected in series and parallel.

6. The resistance-change-type fuse circuit according to claim 1,
wherein the dummy transistor circuit has a voltage follower circuit which lowers an output impedance of a connection node between the dummy transistor and the dummy fuse group.

7. A semiconductor integrated circuit, comprising:
a resistance-change-type fuse circuit which has a plurality of polysilicon fuses capable of causing irreversible change in resistance by flowing a current;
a fuse control circuit which controls whether irreversible change in resistance occurs in the plurality of polysilicon fuses; and
a memory circuit which has a plurality of memory cells and redundant cells, the memory circuit controlling whether the memory cells are replaced with the redundant cells based on the output of the resistance-change-type fuse circuit,
wherein the resistance-change-type fuse circuit includes:
a plurality of polysilicon fuses which are made of polysilicon and causes irreversible change in resistance by flowing a current;
a plurality of programming transistors which are provided corresponding to the plurality of fuses, each programming transistor switching whether to flow the current through the corresponding fuse to cause change in resistance;
a dummy fuse group including a plurality of dummy fuses having the same electrical properties as that of the polysilicon fuses, each dummy fuse having 1/n (n is an integer equal to or more than 1) times a resistance of the polysilicon fuses;
a dummy transistor circuit which has at least one of dummy transistor having 1/n times a conductance of the programming transistors, a gate and a drain of the dummy transistor being connected to each other; and
a current mirror circuit including the programming transistor and the dummy transistor, the current mirror circuit causing each polysilicon fuse to flow n times the current flowing through the dummy fuse group.

8. The semiconductor integrated circuit according to claim 7, further comprising:
- a plurality of program information setting section provided corresponding to the plurality of programming transistors, each program information setting section setting information indicative of causing irreversible change in resistance with respect to the polysilicon fuse corresponding to the programming transistor,
- wherein the current mirror circuit flows the current through the corresponding polysilicon fuse when the information is set to at least one of the plurality of program information setting section.

9. The semiconductor integrated circuit according to claim 7,
- wherein the dummy fuse group has the plurality of dummy fuses connected in series.

10. The semiconductor integrated circuit according to claim 7,
- wherein the dummy fuse group has the plurality of dummy fuses connected in series and parallel.

11. The semiconductor integrated circuit according to claim 7,
- wherein the dummy transistor circuit has a plurality of dummy transistors connected in series and parallel.

12. The semiconductor integrated circuit according to claim 7,
- wherein the dummy transistor circuit has a voltage follower circuit which lowers an output impedance of a connection node between the dummy transistor and the dummy fuse group.

13. A resistance-change-type fuse circuit, comprising:
- a plurality of polysilicon fuses which are made of polysilicon and causes irreversible change in resistance by flowing a current;
- a plurality of programming transistors which are provided corresponding to the plurality of polysilicon fuses, each programming transistor switching whether to flow the current through the corresponding fuse to cause change in resistance with respect to the polysilicon fuses;
- a plurality of trial-cutting polysilicon fuses which have the same electrical properties as those of the plurality of polysilicon fuses;
- a current supply section which flows the current different from each other with respect to the plurality of trial-cutting polysilicon fuses; and
- a resistance estimating section which estimates resistances of the plurality of trial-cutting polysilicon fuses after flowing the current through the plurality of trial-cutting fuses by the current supply section.

14. The resistance-change-type fuse circuit according to claim 13, further comprising:
- a current determination signal generating section which generates a signal to determine a current value when the plurality of polysilicon fuses are programmed based on estimation result of the resistance estimation section.

15. The resistance-change-type fuse circuit according to claim 14, further comprising:
- a program voltage generating circuit capable of generating a plurality of program voltages different from each other for each of the plurality of trial-cutting fuses,
- wherein the current supply section has a plurality of trial-cutting transistors provided corresponding to the plurality of trial-cutting polysilicon fuses, respectively, each of the trial-cutting transistors flowing the current in accordance with the corresponding program voltage with respect to the corresponding trial-cutting fuse.

16. The resistance-change-type fuse circuit according to claim 15, further comprising:
- a plurality of trial-cutting information setting sections provided corresponding to the plurality of trial-cutting polysilicon fuses, respectively, the trial-cutting information setting sections being capable of setting information indicative of causing irreversible change in resistance with respect to the trial-cutting polysilicon fuses,
- wherein the current supply section switches whether to operate the corresponding trial-cutting transistor based on the information set to the plurality of trial-cutting information setting section.

17. The resistance-change-type fuse circuit according to claim 15,
- wherein the resistance estimating section outputs a result of comparing the voltage output from each one end of the plurality of trial-cutting transistors with first and second reference voltages.

18. The resistance-change-type fuse circuit according to claim 17,
- wherein the resistance estimating section includes:
- a first voltage comparator which compares the voltage outputted from the current supply section with the first reference voltage;
- a second voltage comparator which compares the voltage outputted from the current supply section with the second reference voltage higher than the first reference voltage; and
- an estimation result generating section which generates a bit string indicative of estimation result of the resistance value of the plurality of trial-cutting fuses based on comparison result of the first and second voltage comparators.

* * * * *